(12) United States Patent
Kohama et al.

(10) Patent No.: US 6,670,602 B1
(45) Date of Patent: Dec. 30, 2003

(54) SCANNING DEVICE AND SCANNING METHOD

(75) Inventors: Yoshiaki Kohama, Kawasaki (JP); Akihiro Goto, Tokyo (JP); Muneki Hamashima, Urayasu (JP); Yukiharu Okubo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/324,896

(22) Filed: Jun. 3, 1999

(30) Foreign Application Priority Data

Jan. 21, 1999 (JP) ............................................ 11-012726
Jun. 3, 1999 (JP) ............................................ 10-154599

(51) Int. Cl.[7] .................................................. H01J 3/14

(52) U.S. Cl. .................. 250/235; 250/208.1; 250/559.4; 250/310

(58) Field of Search ............................. 250/235, 208.1, 250/559.4, 559.45, 559.3, 201.3, 310, 311, 306, 307, 492.3

(56) References Cited

U.S. PATENT DOCUMENTS

| 5,498,874 A | 3/1996 | Miyoshi et al. ............. 250/397 |
| 5,576,833 A | 11/1996 | Miyoshi et al. ............. 356/394 |
| 6,265,719 B1 * | 7/2001 | Yamazaki et al. .......... 250/310 |

FOREIGN PATENT DOCUMENTS

JP          4-242060          8/1992

OTHER PUBLICATIONS

K. Tsuno, "Simulation Of A Wein Filter As Beam Separator In A Low Electron Mcroscope", *Ultramicroscopy* 55:127–140 (1994), Apr. 1994.

* cited by examiner

Primary Examiner—Que T. Le
(74) Attorney, Agent, or Firm—Oliff & Berridge, PLC

(57) ABSTRACT

New and improved scanning device and corresponding method that include and involve a movable stage on which a specimen is positioned, irradiation means which irradiates an electron beam onto an irradiation region of the specimen, secondary beam detection means used in generating a picture of the irradiation region by detecting a secondary beam which consists of at least one of secondary electrons or reflected electrons from the irradiation region of the electron beam, an imaging electron optical system which causes imaging of the secondary beam on a detection surface of the secondary beam detection means, and which is arranged between the specimen and the secondary beam detection means. The secondary beam detection means is equipped with a fluorescent unit which is arranged on the detection surface, and which converts the secondary beam into light, and one-dimensional line sensors which have a structure arrayed in two dimensions forming electric charge by photoelectric conversion, an array imaging element which continuously adds up the electric charge of the accumulated image in a predetermined line of the line sensors, and the electric charge of the line of the image which moves accompanying the movement of the stage, and a two-dimensional imaging element which emits electric charge by means of photoelectric conversion. The scanning device and corresponding method further include and involve changeover means for selectively irradiating the light converted by means of the fluorescent unit to an imaging element which is either one of the array imaging elements and the two-dimensional imaging element.

11 Claims, 40 Drawing Sheets

SCANNING DEVICE AND SCANNING METHOD

BACKGROUND OF THE INVENTION

1. Field of the Invention

The present invention relates to scanning devices and scanning methods which are used to scan for defects on the surfaces of specimens (e.g., silicon wafers, etc.) and to acquire corresponding specimen pictures using an electron beam.

2. Description of the Related Art

Accompanying the heightened integration of LSI in recent years, there was a demand to further raise the sensitivity of detection of defects on specimens such as on silicon wafers, masks, etc. For example, in a 256 megabit DRAM, a detection sensitivity is required to about a 0.1 $\mu$m defect dimension with respect to a 0.25 $\mu$m pattern dimension. Consequently, a specimen observation and detection device was proposed which used an electron beam, of higher minimum resolving power than the prior art.

For example, in a scanning device described in Japanese Laid-Open Patent Publication No. JP-A-H4-242060, a reflecting electron microscope is disclosed in which, irradiating an electron beam on a specimen surface, the image of reflected (back scattered) from this irradiation region is projected onto a detection surface, and a picture of the specimen is acquired.

Such a reflecting type electron microscope is described with reference to a drawing figure attached to this patent document and which has been identified as "FIG. 16." In FIG. 16, the electron beam irradiated from the electron gun 71, passing through the irradiation lenses 72, is incident on the central portion of the Wien filter 73. The electron beam at this time has its locus curved by the Wien filter 73, and is perpendicularly incident on the specimen 75 on the stage 74.

When the specimen 75 is irradiated by the electron beam, secondary electrons consisting of reflected electrons are emitted from this irradiation region. The secondary beam is not affected by the deflecting action of the Wien filter 73, and proceeds straight on, to be imaged on the fluorescent plate 77 by means of the imaging lens system 76. At the fluorescent plate 77, the reflected electron image is converted into an optical image. The image of the specimen surface can be observed by imaging in a CCD camera or the like.

However, in a scanning device which detects defective places of a specimen, the whole surface of the specimen is imaged, and then the defective places are detected from the pictures of the whole surface of the specimen; this is the sequence generally adopted to observe the defective places.

In the above-mentioned reflecting electron microscope, the case is considered in a drawing figure attached to this patent document which has been identified as "FIG. 17," which shows the observation of defective places in a chip of a semiconductor wafer.

Imaging the whole surface of a chip, by first irradiating the region [1] of the chip with the electron beam, the image of this region is imaged, projected on the fluorescent plate 77 (FIG. 16). Next, the stage 74 is caused to move, and region [2] is irradiated with the electron beam, and similarly this region is imaged. Subsequently, region [3], region [4], . . . are successively irradiated with the electron beam, repeating the imaging, and the whole surface of the chip is imaged.

Nevertheless, at this time, before completing the image of region [1], because the stage 74 moves and the region [2] cannot be imaged, the problem was that each region has to be imaged in one step, and a long amount of time was required for imaging the whole surface of the chip.

Moreover, after imaging the whole surface of the chip, the defective places of the device pattern are detected by carrying out picture processing, and observations are made, imaging these places. At this time, it is the case that the defective places are not enlarged for observation.

For example, taking the local region A in FIG. 17 as a defective place, we consider the case of observing this place, enlarged. The focal length of the imaging lens 76 (FIG. 16) changes, and though the local region A may be projected, enlarged, on the fluorescent plate 77, in the case that the local region A is small the enlargement ratio has to be large, bringing about the disadvantage that the observed image became a dark, low contrast image. Moreover, at this time, due to the effect of the aberration of the imaging lens system 76, the observed image became indistinct and the picture quality of the observed images decreased.

In the scanning device described above, operating to image a wide range of regions so as to image the whole specimen surface, because two imaging operations are necessary to operate the observation of a local region such as a defective place, these two imaging operations had to be made compatible.

In particular, in the case of detecting defective places, because the whole surface of the specimen had to be imaged at high speed, speed was regarded as important in the imaging operation. Moreover, in the case of observing defective places, because it would be preferable to obtain pictures of only these places, picture quality was regarded as more important than speed in the imaging operation.

With other types of scanning devices such as those described in U.S. Pat. No. 5,576,833 and which use a rectangular beam having the beam cross section shaped into a rectangular shape, by scanning on the specimen surface while causing movement of the stage, an increased speed of defect detection was provided.

However, in the scanning device described in U.S. Pat. No. 5,576,833, because a specimen picture projected on a MCP (microchannel plate) is acquired by a line CCD sensor, the rectangular beam projected onto the specimen had to be long and slender, corresponding to the shape of the line CCD sensor. Because of this, the area of the specimen image projected onto the MCP became very small, and the problem arose that the lifetime of the MCP was reduced.

SUMMARY OF THE INVENTION

The present invention solves the aforementioned problems associated with prior scanning devices and methods. In so doing, the present invention provides a new and improved scanning device and corresponding method that include and involve a movable stage on which a specimen is positioned, irradiation means which irradiates an electron beam onto an irradiation region of the specimen, secondary beam detection means used in generating a picture of the irradiation region by detecting a secondary beam which consists of at least one of secondary electrons or reflected electrons from the irradiation region of the electron beam, an imaging electron optical system which causes imaging of the secondary beam on a detection surface of the secondary beam detection means, and which is arranged between the specimen and the secondary beam detection means. The secondary beam detection means is equipped with a fluorescent unit which is arranged on the detection surface, and which converts the secondary beam into light, and one-dimensional line sensors which have a structure arrayed in two dimensions forming electric charge by photoelectric conversion, an array imaging element which continuously adds up the electric charge of the accumulated image in a predetermined line of the line sensors, and the electric charge of the line of the image which moves accompanying the movement of the stage, and a two-dimensional imaging element which emits electric charge by means of photoelectric conversion. The scanning device and corresponding method further include and involve changeover means for selectively irradiating the light converted by means of the fluorescent unit to an imaging element which is either one of the array imaging elements and the two-dimensional imaging element.

BRIEF DESCRIPTION OF THE DRAWING FIGURES

The present invention is described below with reference to the following drawing figures, of which:

Figure 40A:
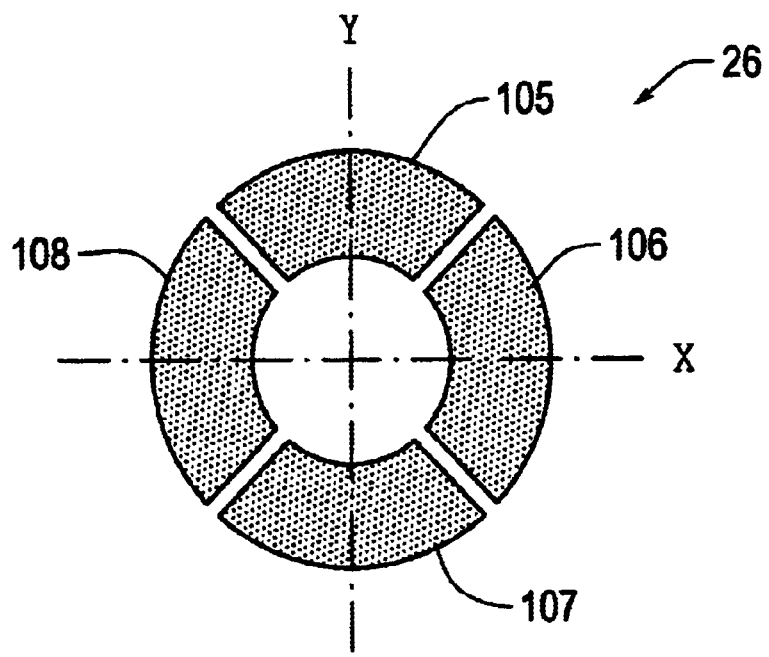
Figure 40B:
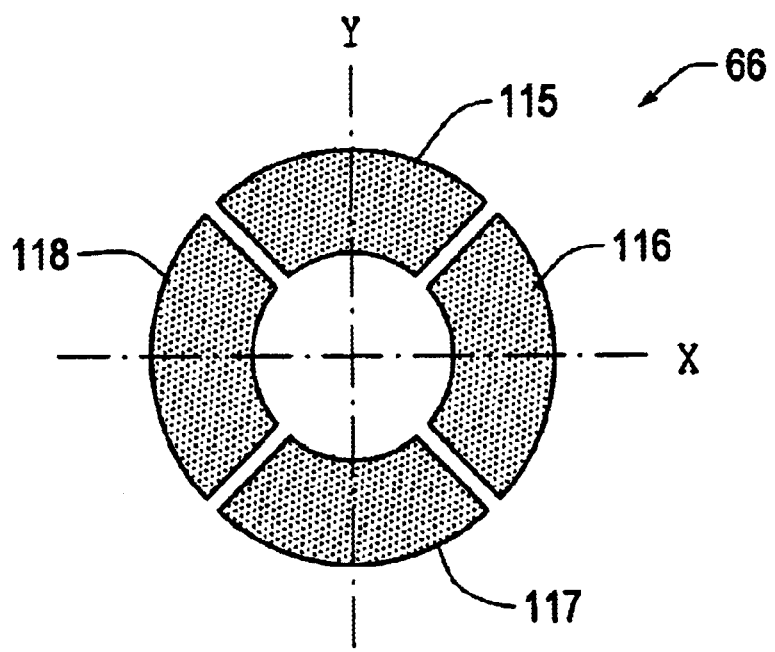

FIGS. 40(A) and 40(B) are diagrams that illustrate electron beam scanning movement.

DETAILED DESCRIPTION OF THE PREFERRED EMBODIMENTS

The present invention is now discussed with reference to the drawing figures that were briefly described above. A discussion of each preferred embodiment of the present invention is followed by a corresponding discussion of its operation. Unless otherwise specified, like parts and processes are referred to with like reference numerals.

In the drawing figures attached hereto, several terms are used to refer to identical structures as described below. For example, the term "first order" is intended to refer to a "primary" beam or device column; the term "second order" is intended to refer to a "secondary" beam or device column; the term "picture" is intended to refer to an image as imaged by the present invention; and the term "irradiation" is intended to refer to processes carried out to form images in the context of the present invention.

Figure 4:
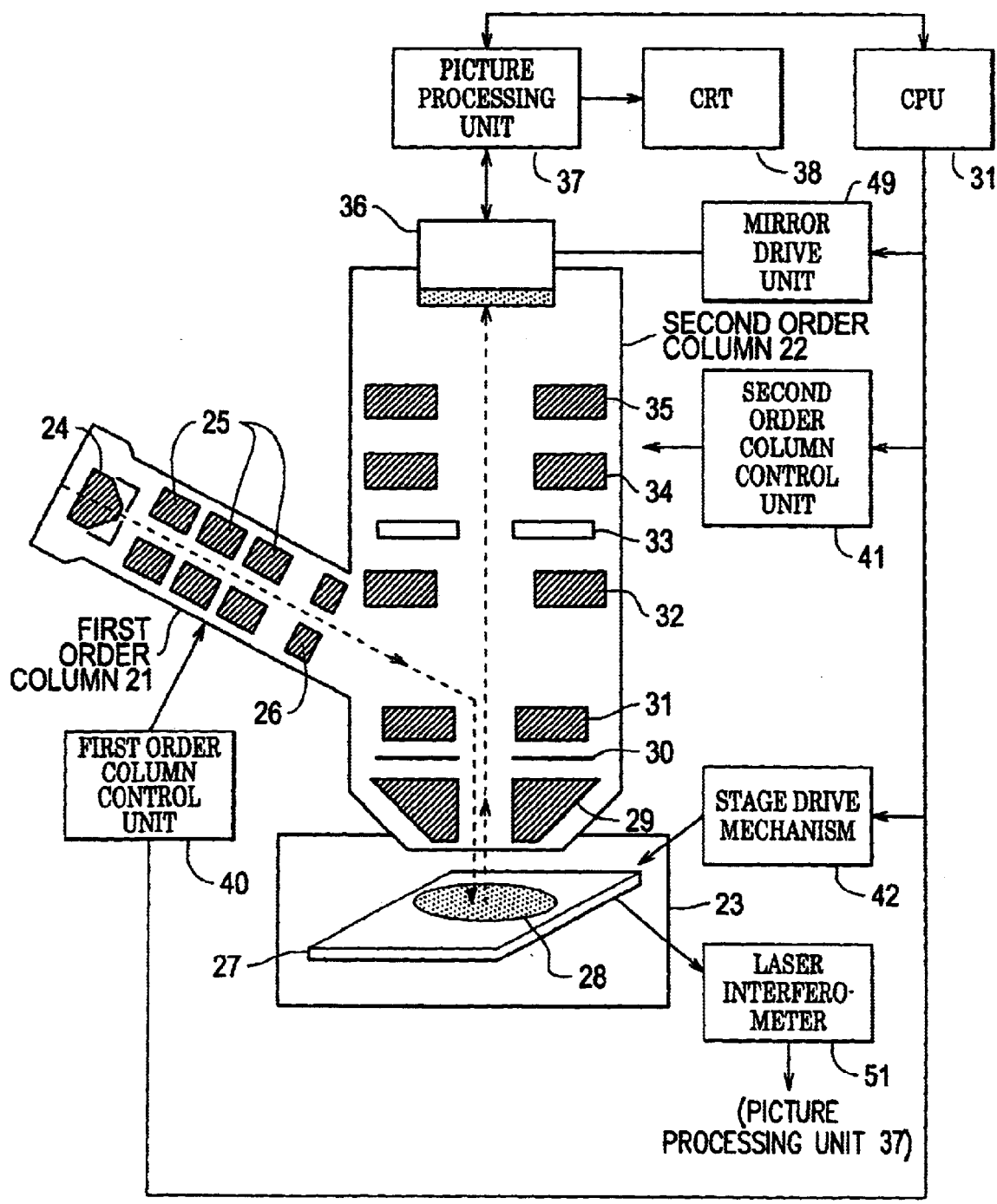
FIG. 4 is a diagram of a the scanning device shown in FIG. 1.

FIG. 4 is a diagram of the whole constitution of the first embodiment. The constitution of this embodiment is described below with reference to the drawings.

In FIG. 4, the scanning device has a primary column 21, a secondary column 22, and a chamber 23. The primary column 21 is mounted obliquely to the side of the secondary column 22, and the chamber 23 is arranged in the lower portion of the secondary column 22.

An electron gun 24 is arranged in the interior of the primary column 21, and a primary optical system 25 and a deflector 26 are arranged on the optical axis of the electron beam (primary beam) irradiated from the electron gun 24.

On the other hand, a stage 27 is arranged within the chamber 23, and a specimen 28 is positioned on the stage 27.

Moreover, in the interior of the secondary column 22, on the optical axis of the secondary beam emitted from the specimen 28, there are arranged a cathode lens 29, a aperture stop 30, a Wien filter 31, a second lens 32, a field stop 33, a third lens 34, a fourth lens 35, and a detector 36. Furthermore, the cathode lens 29, and second lens 32—fourth lens 35, constitute a secondary optical system.

The detector 36 is connected to a image processing unit 37, and the picture processing unit 37 is connected to the CRT 38 and the CPU 39.

The CPU 39 is connected to a primary column control unit 40, a secondary column control unit 41, a stage drive mechanism 42, and a mirror drive unit 49.

The primary column control unit 40 controls the current (voltage) supplied to the deflector 26 and the lens voltage of the primary optical system 25; the secondary column control unit 41 controls each lens voltage of the cathode lens 29 and the second lens 32—fourth lens 35; and the stage drive mechanism 42 controls the drive in the X, Y directions of the stage 27.

A laser interferometer 51 is arranged outside the chamber 23, reads out the position of the stage 27, and transmits stage position information to the picture processing unit 37.

A vacuum exhaust system (not shown in the drawing) connects to the primary column 21, secondary column 22, and chamber 23, and is evacuated by means of a turbo molecular pump, maintaining the interior in an evacuated state.

Figure 5:
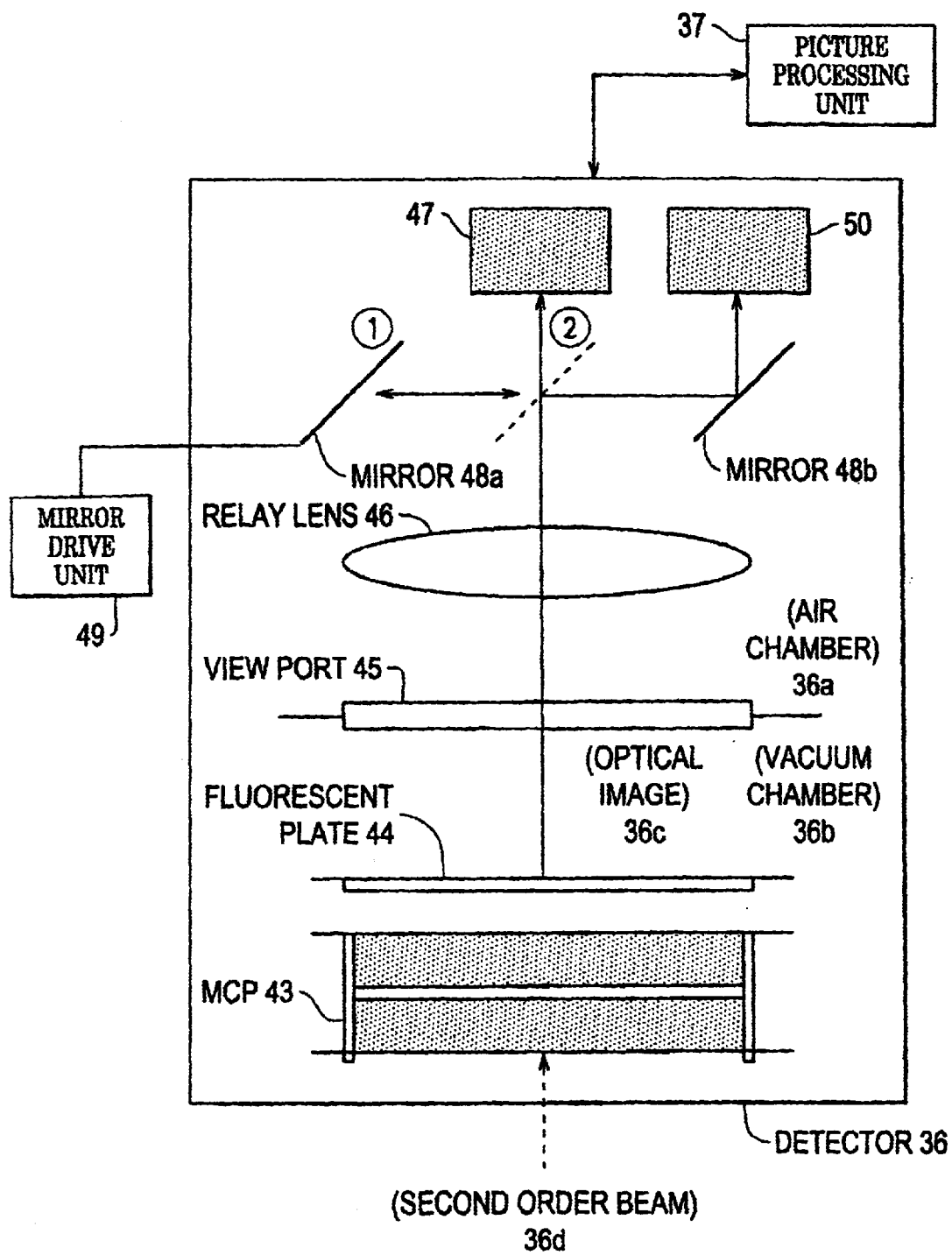
FIG. 5 is a diagram of the detector shown in FIG. 4.

FIG. 5 is a diagram showing the constitution of the detector 36. In FIG. 5, on the beam axis of the secondary beam, a MCP (multichannel plate ) 43, and a fluorescent plate 44, view port 45, relay lens 46, and a TDI array CCD sensor 47 are arranged.

A mirror 48a is arranged positioned obliquely with respect to the optical axis of the relay lens 46, between the relay lens 46 and the TDI array CCD sensor 47. The mirror 48a is connected to a mirror drive unit 49, and is moved (left and right) for insertion and removal with respect to the optical axis of the relay lens 46.

A mirror 48b is arranged positioned obliquely, similarly to the mirror 48a, on the reflection axis of the mirror 48a. Moreover, a two-dimensional CCD sensor 50 is arranged on the reflection axis of the mirror 48b.

Figure 1:
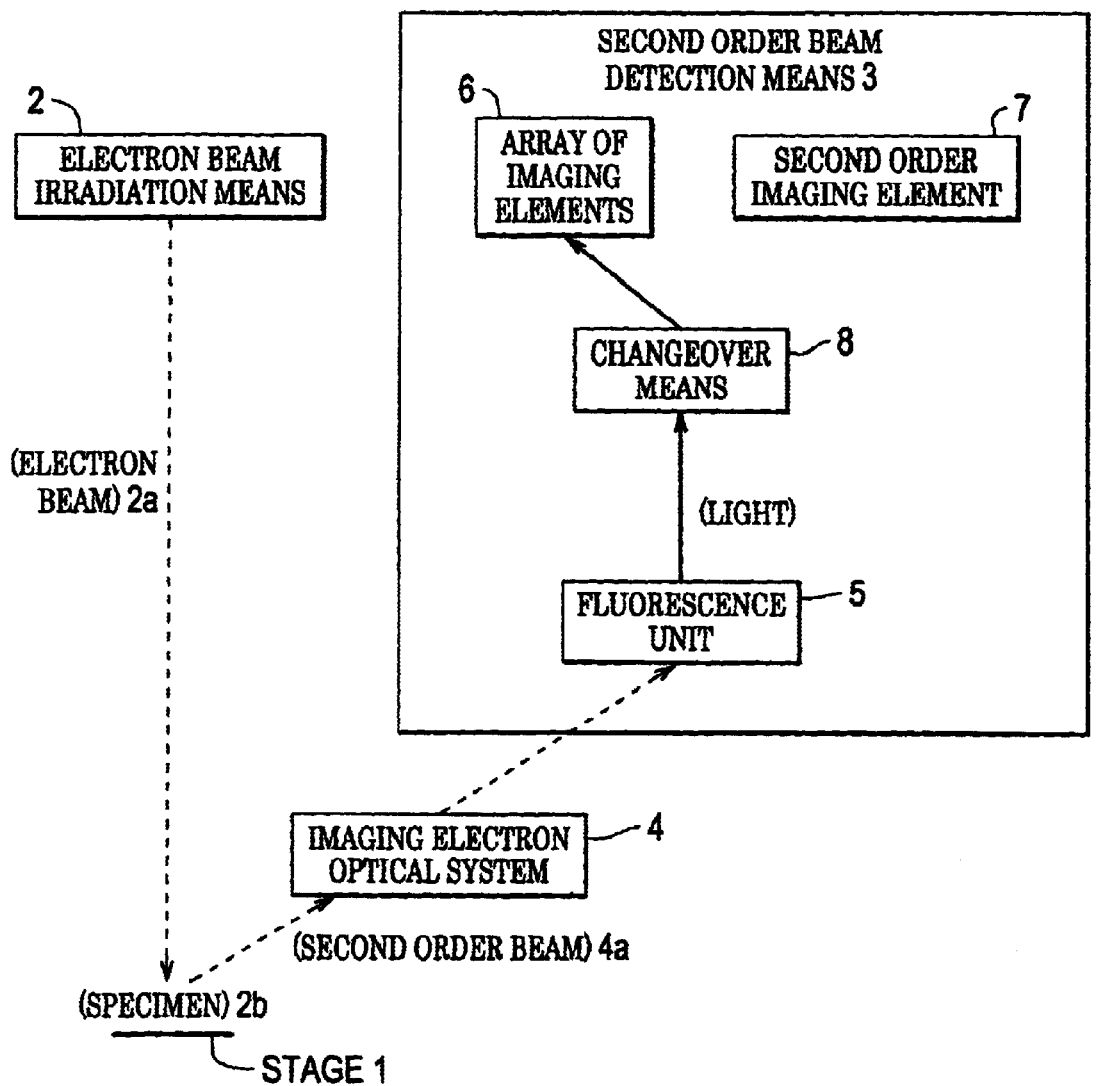
FIG. 1 is a block diagram of a scanning device according to a preferred embodiment of the present invention.
Figure 2:
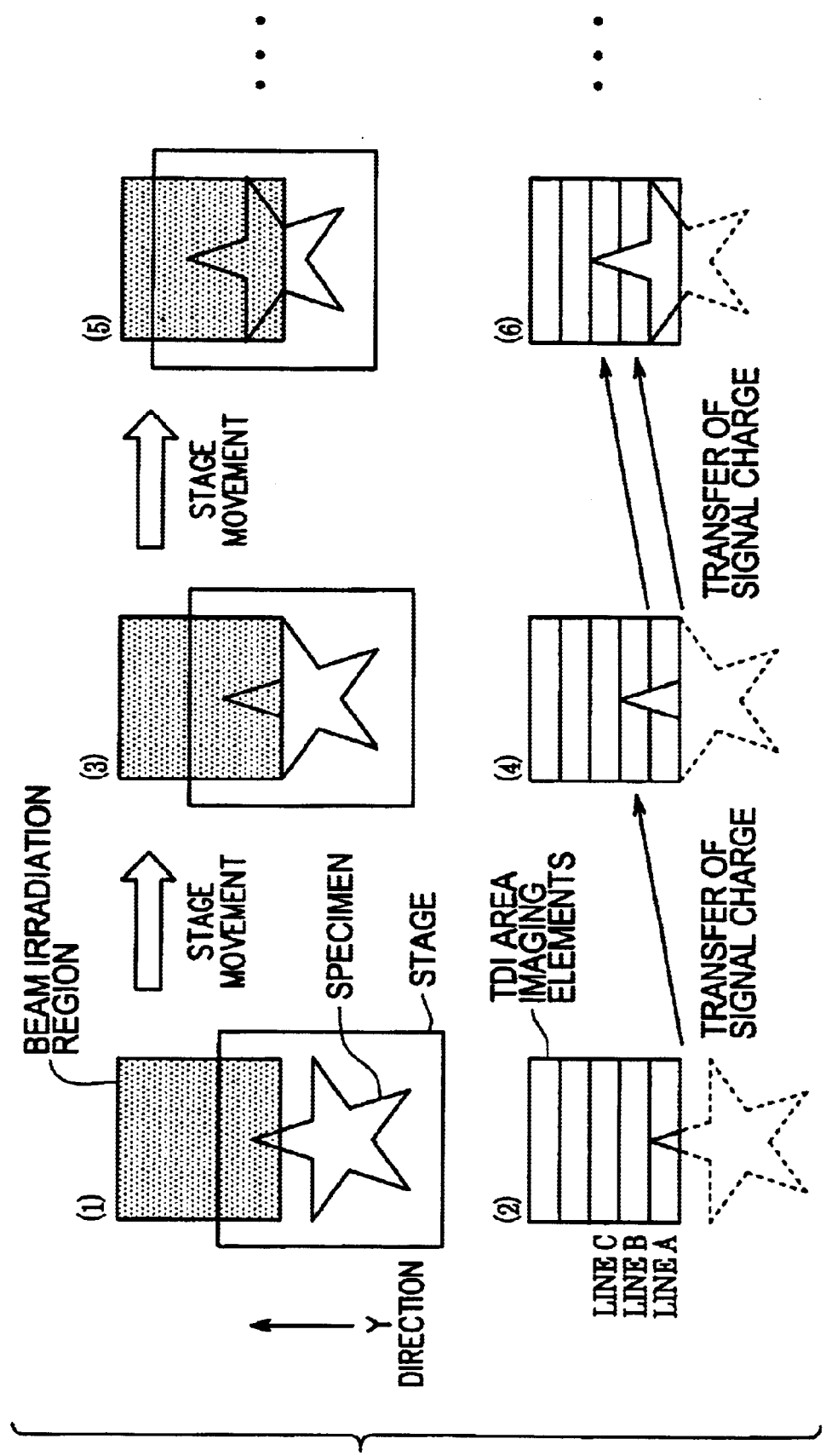
FIG. 2 is a diagram illustrating the imaging operation of the TDI array imaging element.
Figure 3:
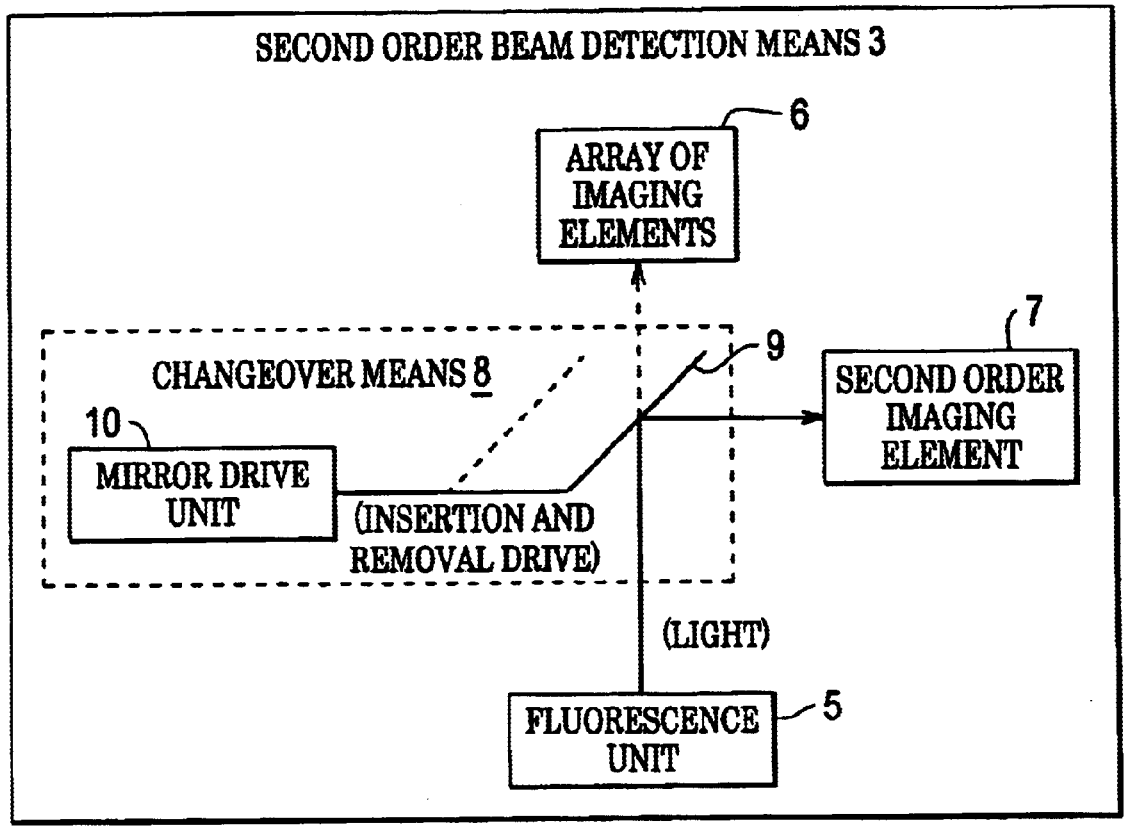
FIG. 3 is a block diagram of the structures of the secondary beam detection means shown in FIG. 1.

Furthermore, as regards the correspondence of the embodiment and FIG. 1, the stage 1 corresponds to the stage 27, the electron beam irradiating means 2 corresponds to the electron gun 24 and the primary optical system 25, the secondary beam detection means 3 corresponds to the detector 36 and the image processing unit 37, the imaging electron optical system 4 corresponds to the cathode lens 29, the second lens 32—fourth lens 35, the fluorescent unit to the fluorescent plate 44, the array imaging element 6 to the TDI array CCD sensor 47, the two-dimensional imaging element to the two-dimensional CCD sensor 50, the mirror 9 to the mirrors 48a, 49b, and the mirror drive unit 10 to the mirror drive unit 49.

The image acquisition operation in this embodiment is next described.

Figure 6:
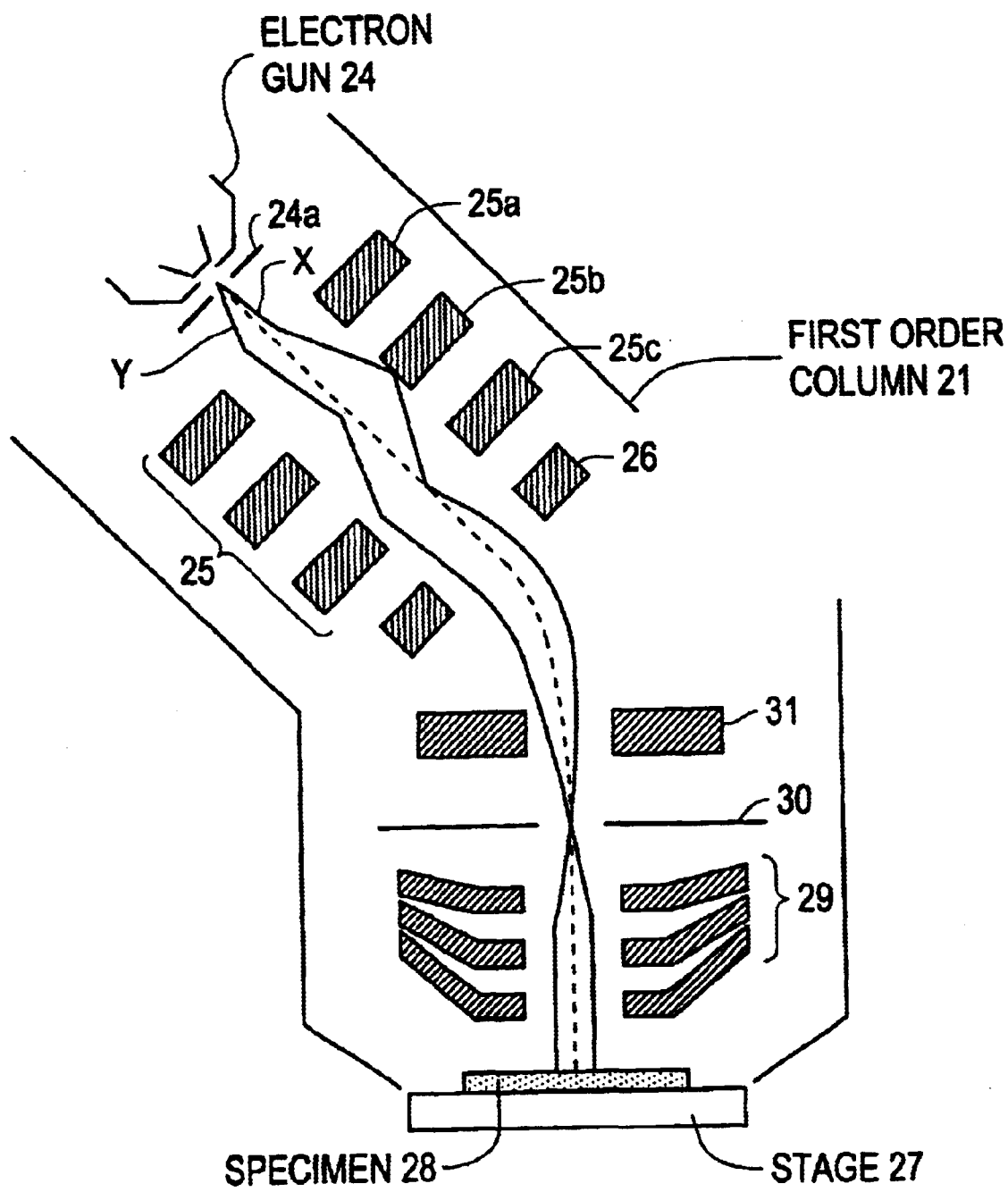
FIG. 6 is a diagram showing the locus of the primary beam.

As shown in FIG. 6, the primary beam 24 irradiated from the electron gun accelerated by the accelerating voltage of the electron gun 24, passes through the primary field stop 24a, receives the lens action of the primary optical system 25 and the deflecting action of the deflector 26, and impinges on the center of the Wien filter 31.

Here, as the cathode of the electron gun, a rectangular cathode uses lanthanum hexaboride ($LaB_6$) from which a large current can be extracted.

Moreover, the primary optical system 25 uses a quadrupole (or octupole) electrostatic lens (or magnetic lens) which is asymmetric relative to the rotation axis. This lens is similar to a so-called cylindrical lens, and can give rise to focusing and a divergence respectively in the long axis (X axis) and short axis (Y axis) of the rectangular cathode. In FIG. 6, the locus of electrons emitted in the X direction cross section and the locus of electrons emitted in the Y direction cross section of the rectangular cathode are shown.

Figure 7:
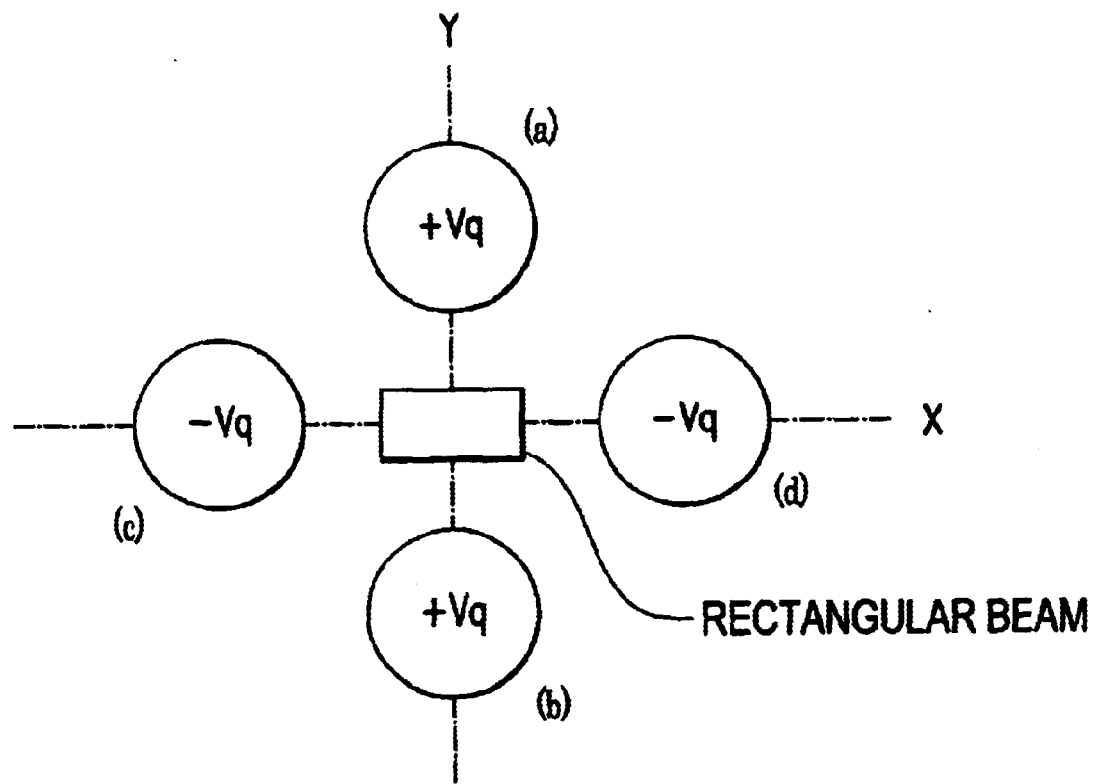
FIG. 7 is a diagram of the primary optical system shown in FIG. 4.

Specifically, the lens constitution, as shown in FIG. 7, in the case of using an electrostatic lens, uses 4 cylindrical rods. The opposite electrodes are disposed at the same voltage, a mutually reverse voltage characteristic (a and b to +Vq, c and d to -Vq) is given.

This lens is constituted by 3 elements (25a, 25b, 25c in FIG. 6) by optimizing the conditions of each lens, there is no loss of irradiated electrons, and the beam irradiation region on the specimen surface can be formed in an optional rectangular shape, or elliptical shape.

The rectangular shaped primary beam from the primary column 25 is deflected by the deflector 26 so as to be)incident centrally on the Wien filter 31; by means of the deflecting action of the Wien filter 31, the locus is curved, and is imaged at the aperture portion of the aperture stop 30. The Wien filter 31 is a deflecting device which causes a magnetic field and an electrical field at right angles; in the case that the electrical field is E, the magnetic field is B, and the velocity of the electrically charged particles is v, only charged particles which satisfy the Wien condition E=vB are rectilinearly propagated, and the orbits of charged particles other than this are curved.

Moreover, because the aperture stop 30 is one which corresponds to an aperture diaphragm, it sets the aperture angle of the cathode lens 29. Its form, a circular hole in a thin film plate made of metal (Mo and the like), prevents surplus electrons scattered in the device from reaching the specimen surface and prevents charging up and contamination of the specimen 28.

The primary beam imaged at the aperture of the aperture stop 30 is irradiated perpendicularly on the surface of the specimen 28 via the cathode lens 29. When the primary beam is irradiated on the specimen surface, a secondary beam arises which contains at least one of secondary electrons or reflected electrons.

This secondary beam comes to have two-dimensional picture information of the irradiation region, but in particular, because the primary beam is irradiated perpendicularly on the specimen 28, the secondary beam can have a clear image without shadows.

Figure 8:
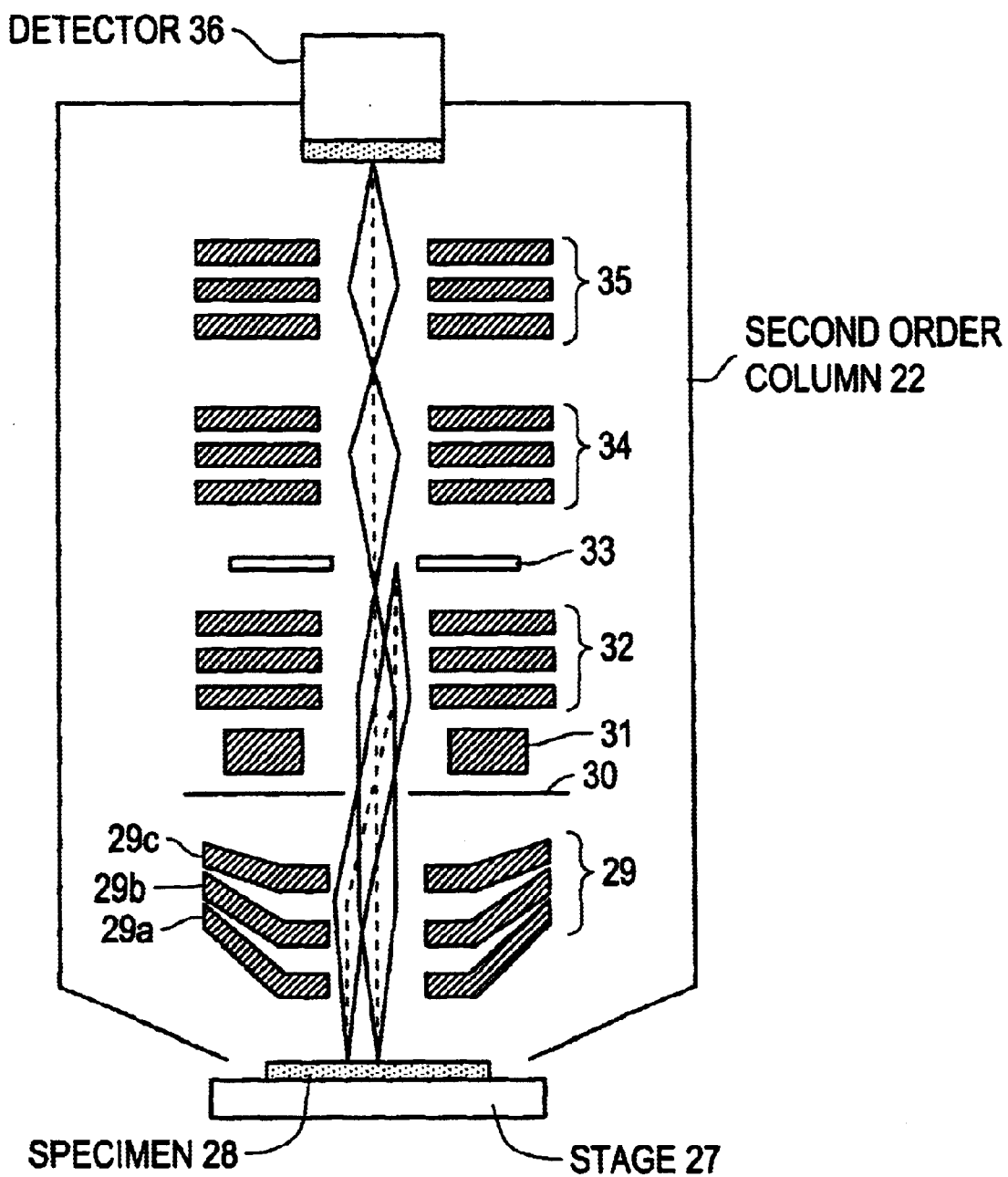
FIG. 8 is a diagram showing the locus of the secondary beam.

As shown in FIG. 8, the secondary beam receives a focusing action by means of the cathode lens 29. The cathode lens 29 is normally constituted by 24 electrodes. Here, a constitutional example is shown of 3 electrodes (29a, 29b, 29c). Normally, to cause functioning as a lens, voltage is applied to the first electrode 29a and second electrode 29b from below; the third electrode 29c is set at zero potential.

Voltage is applied to the electrode 29a and the stage 27 (retarding voltage), a negative electrical field with respect to the primary beam between the electrode and specimen surface, forms a positive field with respect to the secondary beam.

By means of the retarding voltage, the cathode lens 29, with respect to the primary beam, causes deceleration, preventing charging up and contamination of the specimen, with respect to the secondary beam, brings in electrons (particularly, secondary electrons of low directionality), causes acceleration, and acts so as to guide into the lens with good efficiency.

The secondary beam which passes through the cathode lens 29 and aperture stop 30 is not affected by the deflecting action of the Wien filter 31, and travels rectilinearly, unchanged. At this time, by changing the magnetic field applied to the Wien filter, only electrons having a specific energy band (for example, secondary electrons, or reflected electrons) can be guided to the detector 36.

Moreover the aperture stop 30, with respect to the secondary beam, plays a part in suppressing lens aberrations of the later stage second lens 32—fourth lens 35.

However, when the secondary beam is caused to image by the cathode lens only, the lens action is strong and aberration easily arises. Consequently, combining with the second lens 32, a first imaging is performed. The secondary beam obtains an intermediate image on the secondary field stop 33 by means of the cathode lens 29 and the second lens 32.

Moreover, lenses are arranged in a later stage to project the intermediate image, but in order to maintain the necessary projection magnification as a secondary optical system, the constitution has two added lenses, a third lens 34 and a fourth lens 35. The secondary beam, respectively imaged by the third lens 34 and fourth lens 35, is here imaged a total of 3 times. Furthermore, the combination of the third lens 34 and fourth lens 35 may cause imaging once (total 2 times).

The second lens 32, third lens 34 and fourth lens 35 are unipotential or Einzel lenses, and are symmetrical with respect to the rotation axis; each lens is constituted by 3 electrodes. Normally the outer 2 electrodes are at zero potential, and the lens action is controlled by changing the voltage applied to middle electrode.

Moreover, the secondary field stop 33 is arranged at the intermediate image point, but this secondary field stop 33, similarly to the visual field stop of an optical microscope, screens the excess beam together with the later stage third lens 34 and fourth lens 35, preventing charging up and contamination of the detector 36.

The secondary beam, repeating converging and diverging by means of the third lens 34 and the fourth lens 35, is re-imaged at the detection surface of the detector 36, and an image of the beam irradiation region is projected onto the detector surface.

As shown in FIG. 5, the secondary beam is incident on the MCP 43, is accelerated and amplified while passing through the MCP 43, and strikes the fluorescent plate 44. The fluorescent plate 44 converts the secondary beam into light, converting the projected electron image into an optical image.

The optical image, passing through the view port 45 which separates the vacuum chamber and the atmospheric pressure chamber, via a relay lens 46, projects on one or other of the sensors, the TDI array CCD sensor 47 or the two-dimensional CCD sensor 50. This operation is specifically described below.

The mirror drive unit 49, according to instructions of the CPU 39, drives the insertion and removal of the mirror 48a with respect to the optical axis of the relay lens 46. At this time, in the case (FIG. 5) that the mirror 48a is out of the optical the light from the relay lens 46 is incident on the TDI array CCD sensor 47. Moreover, in a case (FIG. 5) in which the mirror 48a is positioned on the optical axis, the light from the relay lens 46 is reflected by mirror 48a and mirror 48b, and is incident on the two-dimensional CCD sensor 50.

When photoelectric conversion is performed by either sensor, the image processing unit 37 successively reads out the photoelectric signal, and forms a specimen picture, A/D converted and stored in internal VRAM. The image processing unit 37, according to instructions of the CPU 39, causes display of this specimen picture on the CRT 38.

In this manner, in the scanning device of this embodiment, an electron beam is irradiated onto the specimen surface, and the image of the beam irradiation region, projecting onto the detection surface of the detector 36, acquires specimen pictures batch-wise.

Next, a description is given of the operations of detection and observation of the defective places on a specimen such as defective places on a specimen surface.

In FIG. 5, the mirror drive unit 49, according to mirror drive instructions from the CPU 39, drives the mirror 48a to the position [1], and changes over to the use of the TDI array CCD sensor 47.

In the operation of detecting defective places, firstly the whole chip is imaged by means of the TDI array CCD sensor; next, defective places are detected from the imaged specimen image.

The imaging operation of the TDI array CCD sensor 47 is specifically described below.

Figure 9:
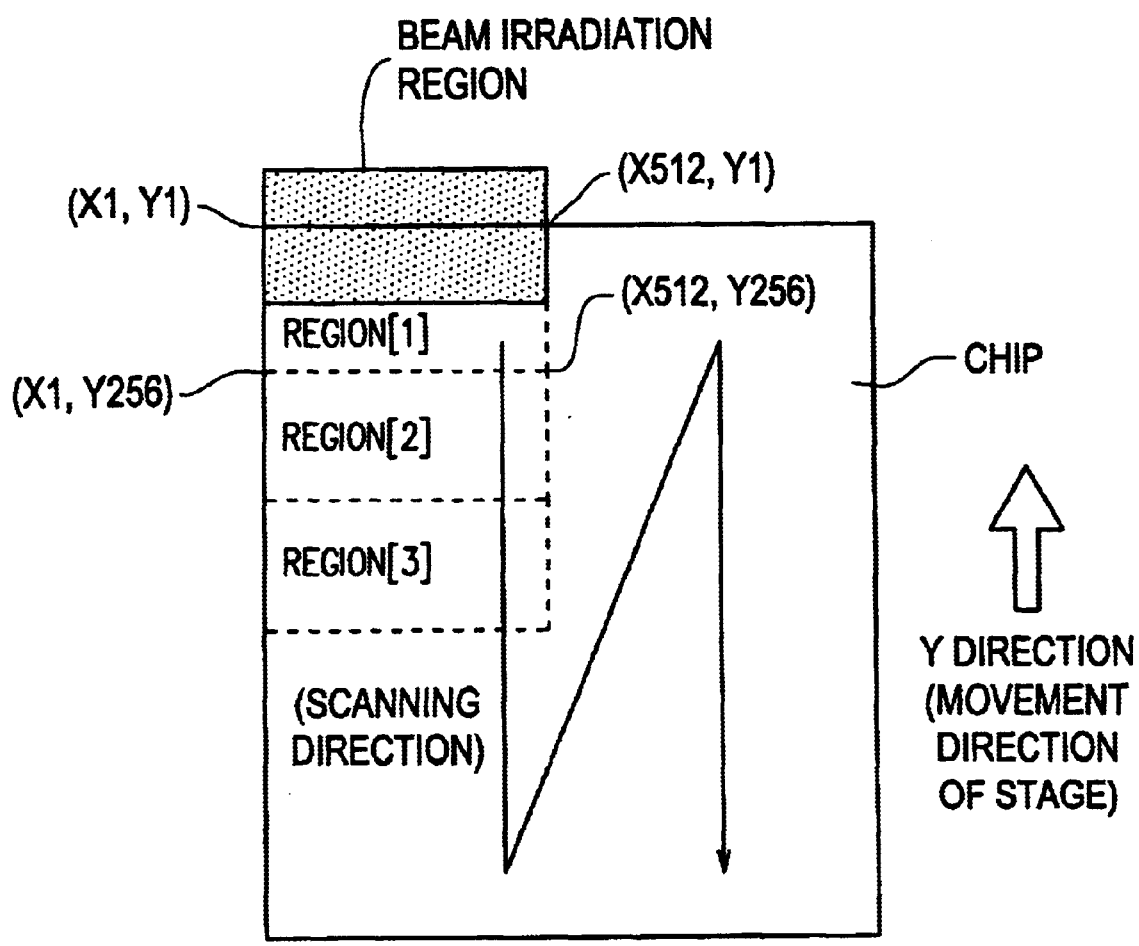
FIG. 9 is a diagram illustrating the operation of a TDI array CCD sensor.

As shown in FIG. 9, a region [1] from (X1,Y1) to (X512,Y256) is defined on the chip, the electron beam is irradiated on this region [1], the image of the irradiation region projects and images to the TDI array CCD sensor 47. At this time, the TDI array CCD sensor 47 has 512×256 pixels, the region [1] is projected to fit the TDI array CCD sensor 47.

Figure 10:
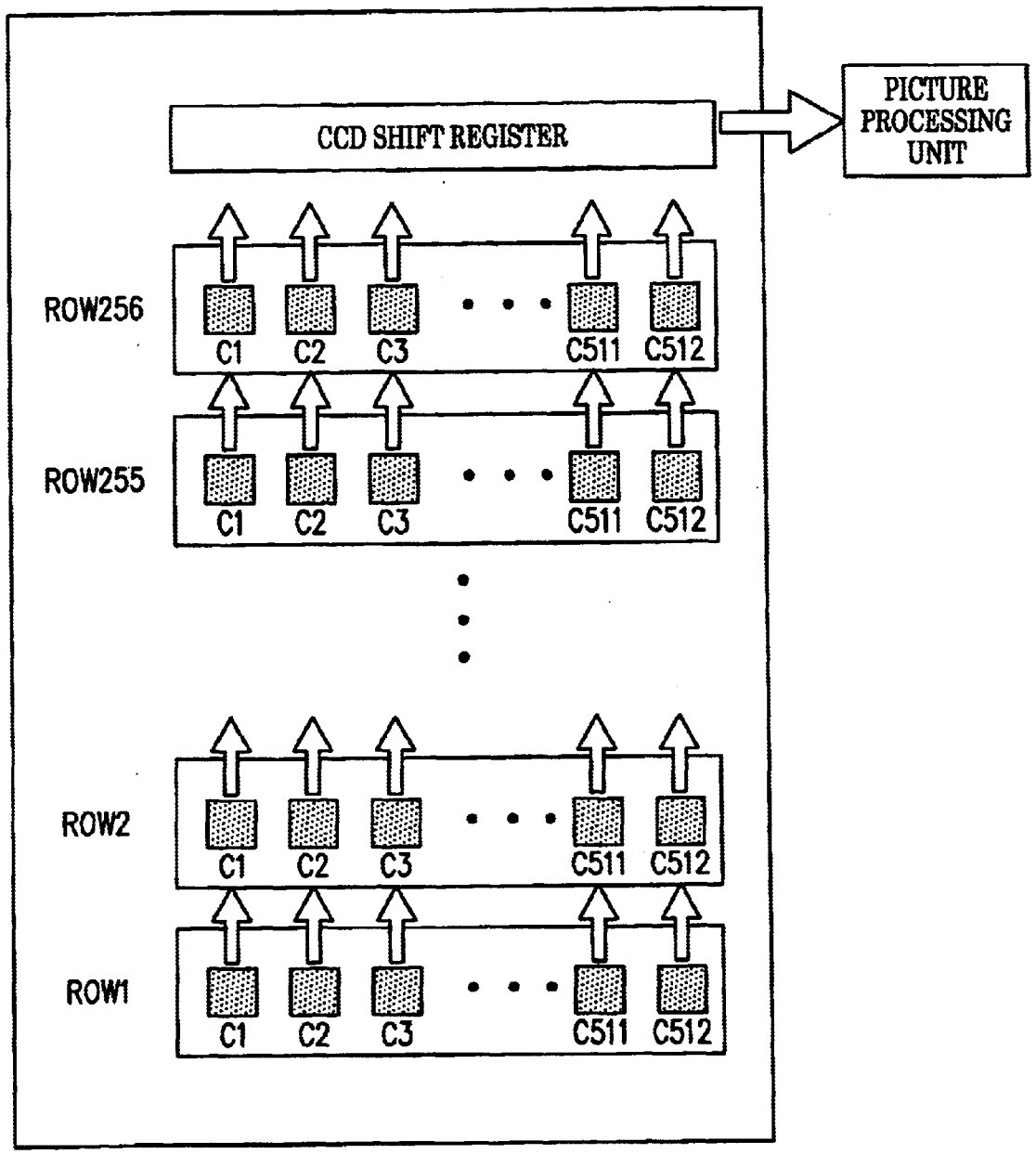
FIG. 10 is a block diagram of a TDI array CCD sensor.

Now, the primary beam is irradiated from (X1,Y1) to (X512,Y1) of the region [1]. At this time, this 1 line of image is projected on the TDI array CCD sensor 47, and imaged. The signal charge is accumulated in ROW 1 of the TDI array CCD sensor 47 shown in FIG. 10. Next, the CPU 39 outputs a drive control signal to the stage drive mechanism 42, and the stage drive mechanism 42 drives the stage 27 in the Y direction. Thereupon, the beam irradiation region moves in the scanning direction by just the horizontal scan line of the TDI array CCD sensor 47. At the same time as this, the laser interferometer 51 sends a vertical clock signal to the image processing unit 37.

The image processing unit 37, when it inputs the vertical clock signal, sends a forwarding pulse to the TDI array CCD sensor 47. The TDI array CCD sensor 47, synchronously with the forwarding pulse, forwards the stored signal charge in ROW 1 to ROW 2. At this time, the image from (X1,Y1) to (X512,Y1) is imaged in ROW 2, because signal charge is previously accumulated, the signal charge which comes to be forwarded from ROW 1 becomes added and accumulated. Moreover, at this time, in ROW 1, the image from (X1,Y2) to (X512,Y2) is imaged, a new signal charge is accumulated.

Furthermore, in ROW 3, the signal charge forwarded from ROW 2 is added and accumulated. Moreover, in ROW 2, the image of from (X1,Y2) to (X512,Y2) is imaged, signal charge is accumulated, but when the aforementioned transfer pulse is received, the signal charge which came to be forwarded from ROW 1 is added and accumulated. Moreover, in ROW 1, the image of from (X1,Y3) to (X512,Y3) is imaged, and new signal charge is accumulated.

In this manner, by successively driving the stage 27 in the Y direction, the beam irradiation region scanning the region [1], the TDI array CCD sensor 47, according to the driving of the stage 27, successively forwards to the adjacent ROW the signal charge which accumulates. Repeating this operation, from (X1,Y256) to (X512,Y256) the image is imaged, its signal charge can be accumulated in ROW 1, the signal charge from (X1,Y1) to (X512,Y1), adding and cumulating a number of scan lines, is accumulated in ROW 256.

In this state, when the TDI array CCD sensor 47 inputs a forwarding pulse, the signal charge accumulated in ROW 256, via a forwarding gate (not shown in the drawing), is forwarded to the CCD shift register, extracted from the TDI array CCD sensor 47 for each horizontal line scan, is forwarded to the picture processing unit 37.

The picture processing unit 37, A/D converts the successively forwarded signal charge and stores it in VRAM, forming the image of region [1].

Below, similarly causing the stage 27 to move, imaging is performed of region [2], region [3], . . . by means of the TDI array CCD sensor 47, and the whole surface of the chip is imaged.

In this manner, because imaging causes a shift of signal charge in the TDI array CCD sensor 47 according to the movement of the stage 27, the movement of the stage 27 and the imaging action can be carried out in parallel. Accordingly, the whole chip surface can be imaged in a very short time. Moreover, because in the TDI array CCD sensor 47, adding a number of horizontal scan lines just the same signal charge of the same places can be enumerated, an increase of the S/N of the picture can be provided for.

Next, when the acquisition of the picture of the whole chip has been completed, the image processing unit 37, comparing the pictures of each region and the previously prepared template pictures based on design data, specifies the defective places. Specifically, the image processing unit 37, after performing noise reduction by means of an edge preserving smoothing filter with respect to the acquired picture, for the template image and the picture of each region, finds the binary difference of the corresponding picture output and its counterpart, determines whether or not this value exceeds a predetermined threshold value, and determines that there is a defect in a place where it exceeds this value.

The CPU 39 enumerates which positions are these defective places on the chip, and stores this address information in internal memory.

However, in the image from the TDI array CCD sensor 47, in a case in which the operator wishes to continually observe the defective places, it was necessary to constantly repeat the driving of the stage 27. For example, in the case of wishing to continuously observe region [1], according to the starting point of the stage 27, the stage 27 is moved successively in the Y direction, and scans the region [1]. When the scan ends, the stage again according to the start position again repeats the scan of region [1].

In this manner, with the TDI array CCD sensor 47, when continuously observing defective places, because the moving and stopping action of the stage 27 is constantly repeated, there was a possibility of a slight vibration (hunting) arising in the stage 27. Because of this hunting, when imaging by means of the TDI array CCD sensor 47, a displacement arose in the image, and there was a risk of a decreased picture S/N of the observation picture.

Consequently, in the observation of defective places, the two-dimensional CCD sensor 50 is used. In FIG. 5, the mirror drive unit 49, according to the mirror drive instructions of the CPU 39, drives the mirror 48a to the position of [2], changing over to the use of the two-dimensional CCD sensor 50.

The CPU 39, based on the address information of the defective places, outputs a drive control signal to the stage drive mechanism 42, and the stage drive mechanism 42 drives the stage 27 and performs positioning such that the electron beam strikes the defective place.

When positioning ends, the electron beam is irradiated on the defective place, and the image of the defective place, via the secondary optical system, is caused to project in the detection surface of the detector 36; this image is imaged by the two-dimensional CCD sensor 50 and is displayed on the CRT 38. In this manner, the operator can continually observe defective places.

In the scanning device of such an embodiment, it becomes possible to image the whole surface of a chip in a short time, imaging by means of the TDI array CCD sensor 47. On the other hand, with respect to defective places, by means of imaging with the two-dimensional CCD sensor 50, defective places can be continually observed with high precision and without a reduction of picture quality.

Figure 11:
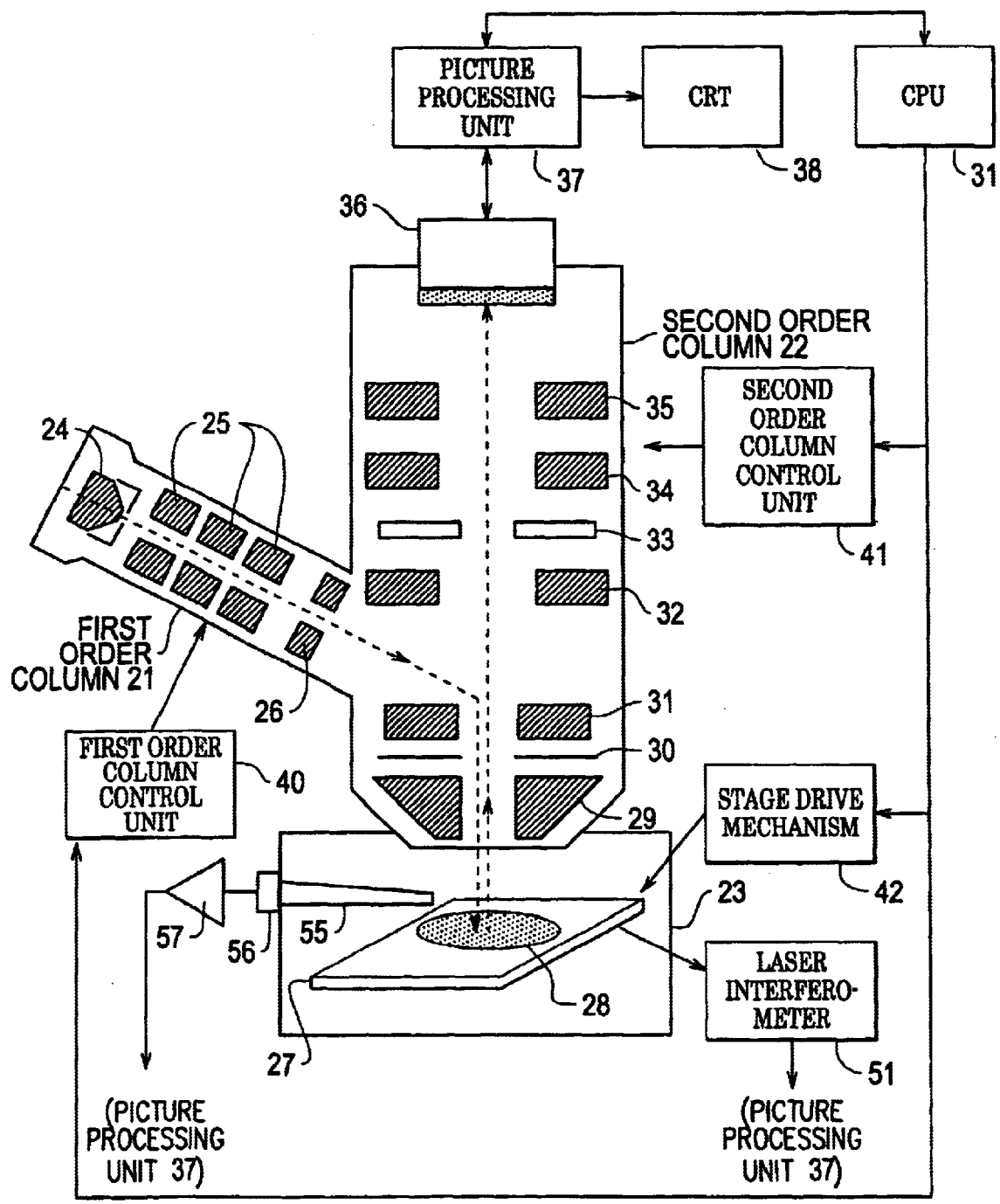
FIG. 11 is a diagram of a second preferred embodiment according to the present invention.
Figure 12:
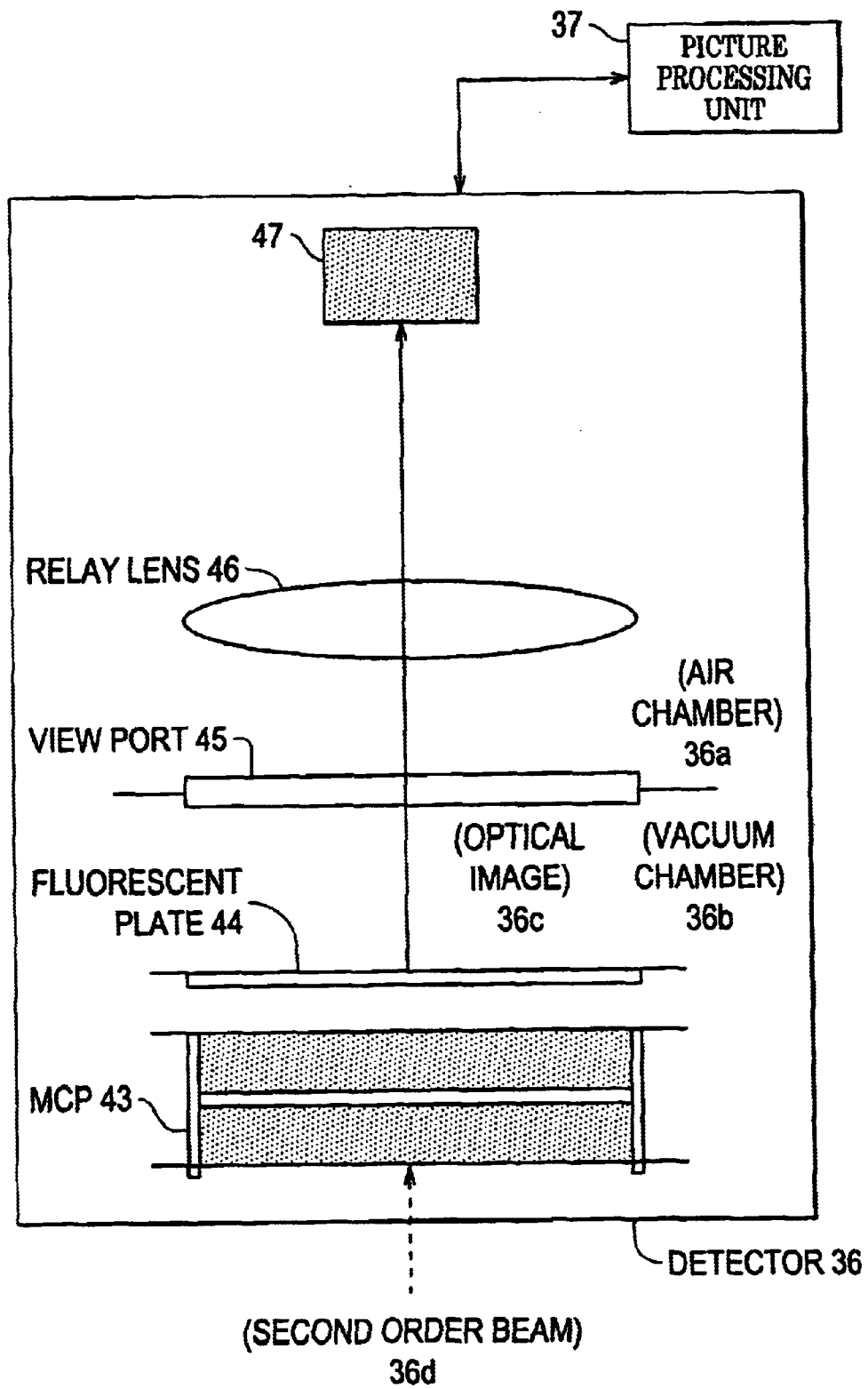
FIG. 12 is a diagram of the detector of the second preferred embodiment shown in FIG. 11.

FIG. 11 is an overall constitution diagram of a second embodiment. Furthermore, the second embodiment as shown in FIG. 11, the characteristic features of the second embodiment are the point that a scintillator 55 is disposed in the interior of the chamber 23, a photoelectric amplifier tube in the after stage of the scintillator 55, and a preamplifier 57 is disposed, and as shown in FIG. 12, the point that the mirror drive unit 49, mirrors 48a, 48b, and two-dimensional CCD sensor 50 are omitted. Furthermore, as regards other constitutional essentials, the same reference are given as in FIGS. 4 and 5, and a description is omitted.

Moreover, the second embodiment, the electron beam radiating means corresponds to the electron gun 24, the primary optical system 25, and the primary column control unit 40; the secondary beam detection means corresponds to the detector 36; the imaging electron optical system corresponds to the cathode lens 29, and the second lens 32—fourth lens 35; the scanning means corresponds to the deflector 26; and the electron detection means corresponds to the scintillator 55, photoelectric amplifier tube 56, and preamplifier 57.

Next, the operations of detection of defective places and observation of defective plated by the present preferred embodiment are described.

The operation of detection of defective places has already been described with reference to the first embodiment, and is omitted here.

In this embodiment, in the observation of defective places, the defective places are scanned by means of a spot beam instead of the rectangular beam, and pictures of the defective places are acquired.

Specifically, CPU 39, based on the address information of the defective places, outputs a drive control signal to the stage drive unit 42. The stage drive unit 42 performs position adjustment of the stage 27 such that the electron beam strikes the defective place.

The CPU 39, via the primary column control unit 40, controls the lens voltage values of the primary optical system 25, moreover via the secondary column control unit 41, controls the lens voltage of the cathode lens 29, to shape the primary beam from a rectangular beam to a spot beam.

The specific voltage values (units, kV) applied to the respective lenses at this time are shown in a table below. However, the energy of the primary beam is 4.8 keV. Moreover, when converting from the rectangular beam (actually nearer elliptical than rectangular) to a spot beam, an alteration of the retarding voltage (units, kV) and a changeover of the visual field stop diameter of the visual field stop 24a become necessary. These values are also shown in the table presented below.

|  | Rectangular beam (1500 μm × 292 μm) | Spot beam (diameter 5 μm) |
|---|---|---|
| lens 25a | ±2.2 | ±1.3 |
| lens 25b | ±0.23 | ±0.22 |
| lens 25c | ±0.17 | ±0.17 |
| cathode lens 29a | +16 | +16 |
| cathode lens 29b | −1.7 | −4.5 |
| retarding voltage | −4 | 0 |
| Primary field stop Diameter | 160 μm | 10 μm |

The deflector 26, according to the horizontal scan signal and vertical scan signal from the primary column control unit, controls the deflection of the spot beam, and repeatedly scans the spot beam over the defective places. At least one of the secondary electrons or reflected electrons which arise during this are detected by means of the scintillator 55, the detection signal is amplified by the photoelectric amplifier tube 56 and the preamplifier 57, and is transmitted to the picture processing unit 37.

At the image processing unit 37, synchronously with the horizontal scan signal and the vertical scan signal, the detection signal is A/D converted and successively stored in VRAM, forming an image of the defective place, which is displayed on the CRT 38.

In this manner, in the second embodiment, the whole surface of a specimen is imaged at high speed by means of the TDI array CCD sensor 47 and defective places are detected. Then, the spot beam is caused to scan with respect to the defective places, and a picture of a defective place is formed and acquired based on the electrons arising during this.

In particular, in this embodiment, even if the defective places are very small local regions, if a region is scanned, stopping down the beam diameter, an enlarged observation image of the defective place can be acquired in a simple manner. Accordingly, even raising the enlargement magnification, the observation image does not become dark, moreover does not become indistinct, and the operator, regardless of the enlargement magnification, can continually observe the picture with high precision.

Furthermore, in the first embodiment, the two-dimensional CCD sensor 50 was used in order to observe the defective places, but there is no limitation to this, and it is also possible to use the device for adjustment uses. For example, before the operation of detecting defective places is performed, if a test pattern is imaged by means of the two-dimensional CCD sensor 50, while viewing its image, adjustments of the primary optical system 25 or secondary optical system, focus adjustment, aberration adjustment, luminosity adjustment in the detector 36, and the like preliminary adjustments of the device can be performed. Moreover, in the second embodiment also, because a picture of a test pattern can be acquired by scanning by means of the spot beam, lens adjustments of the primary optical system 25 or cathode lens 29, and axial setting adjustments of the electron beam by means of the deflector 26, can be performed.

Figure 13:
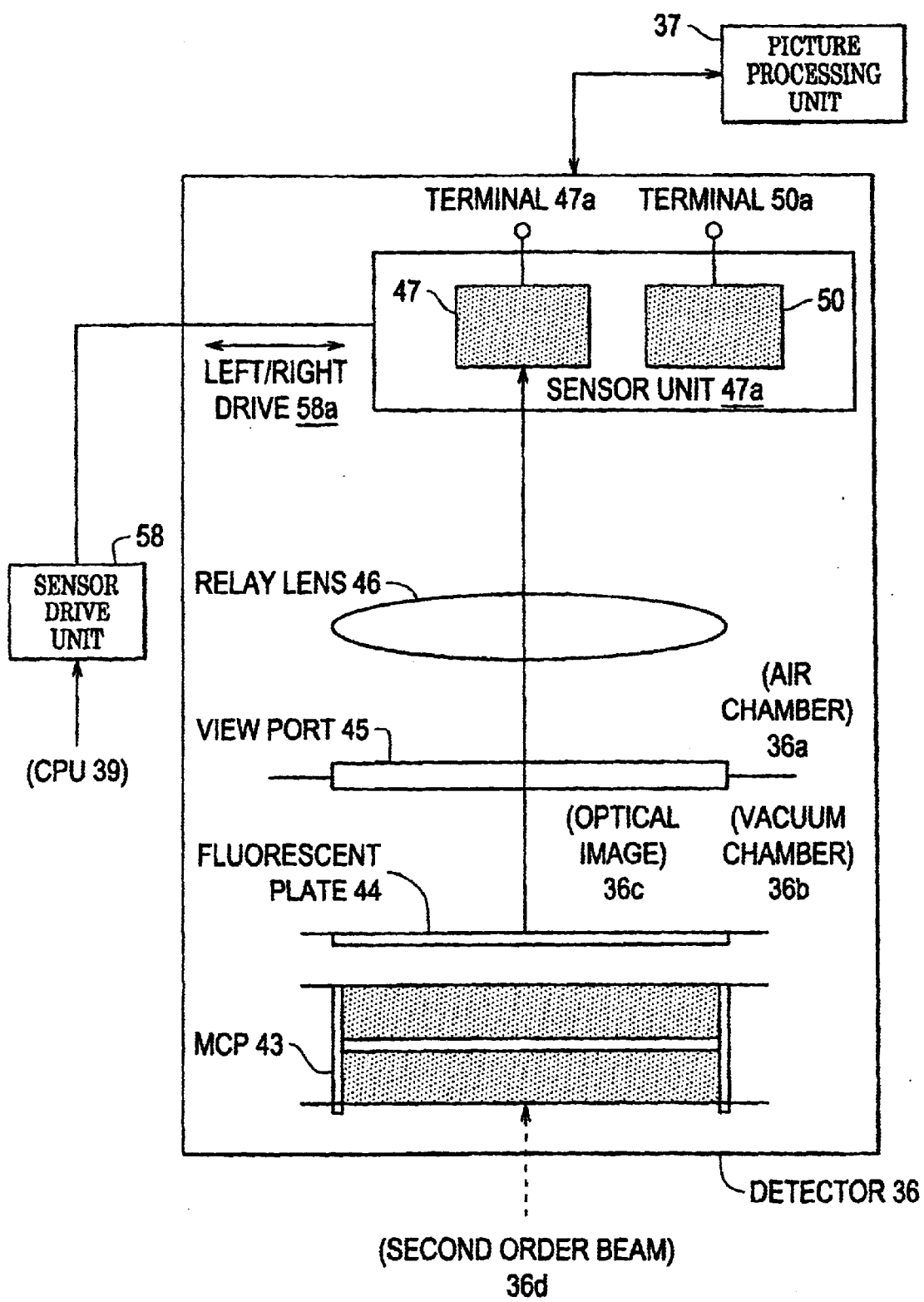
FIG. 13 is a diagram showing another exemplary detector.

Moreover, in the first embodiment, it was optically changed over using mirror 48a as changeover means, but there is no limitation to this. For example, as shown in FIG. 13, a constitution may dispose a sensor drive unit 58 disposed to drive a sensor unit having the TDI array CCD sensor 47 and the two-dimensional CCD sensor 50.

Moreover, driving the sensor unit to left and right by means of this sensor drive unit 58, either sensor may be changed over to receive incident light from the relay lens 46. At this time, when the TDI array CCD sensor 47 is selected, the signal charge is read out via the terminal 47a, and when the two-dimensional CCD sensor 50 is selected, the signal charge is read out via the terminal 50a.

Figure 14:
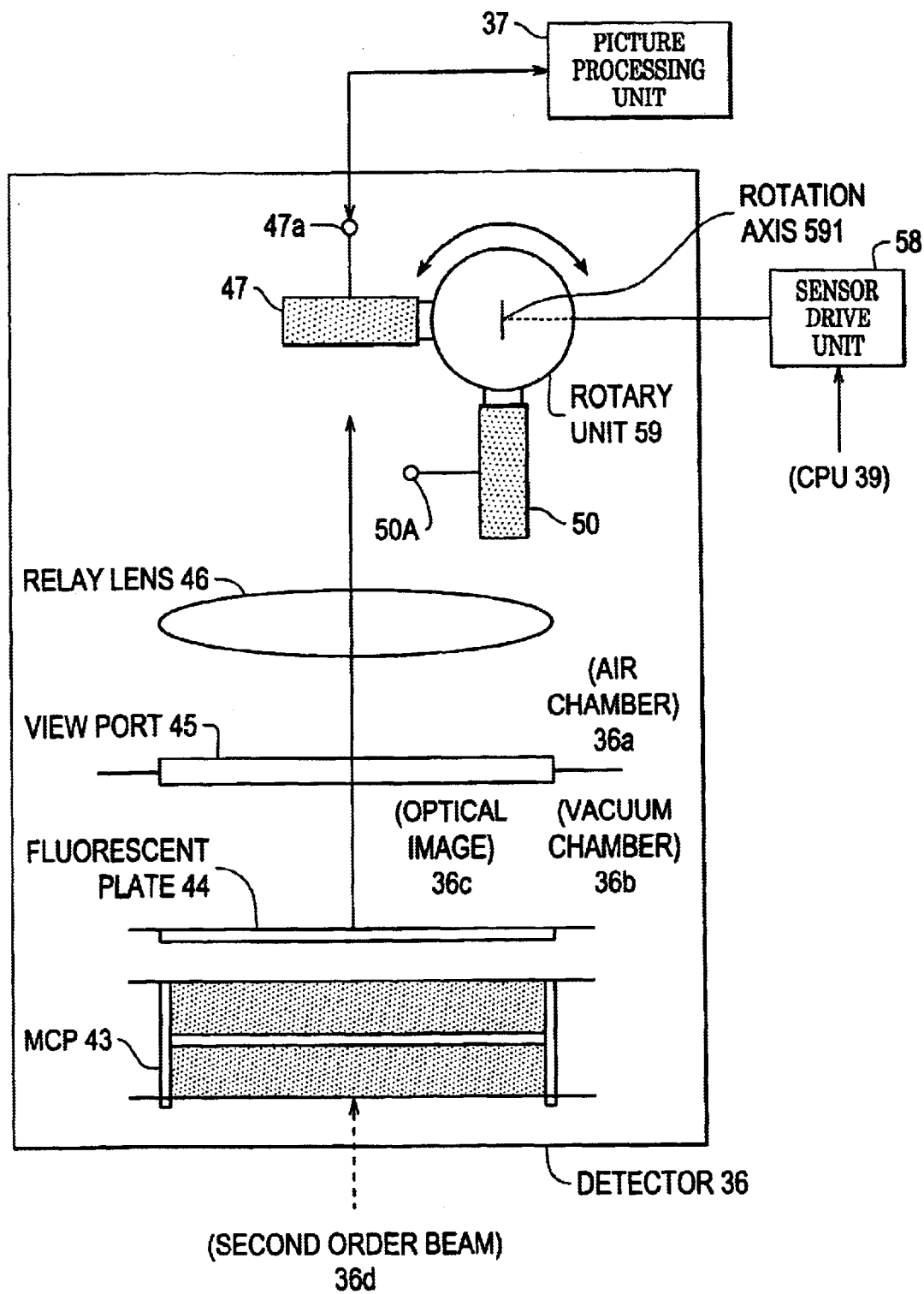
FIG. 14 is a diagram showing another exemplary detector.

Moreover, as shown in FIG. 14, may be constituted with the TDI array CCD sensor 47 and the two-dimensional CCD sensor 50 disposed on the side surface of a cylindrical rotary unit 59. In this constitution, the rotary unit 59 is rotated with a rotation axis 591 as center by means of a sensor drive unit 58. At this time, when the TDI array CCD sensor 47 is selected, the signal charge is read out via the terminal 47a, and when the two-dimensional CCD sensor 50 is selected, the signal charge is read out via the terminal 50a.

Figure 15:
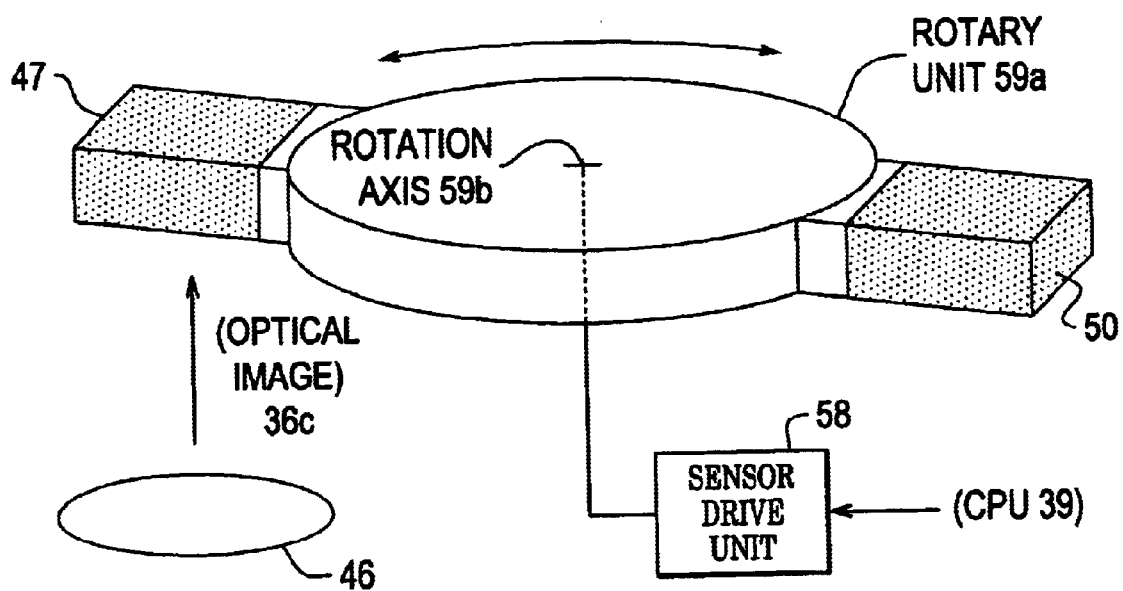
FIG. 15 is a diagram showing another exemplary detector.
Figure 16:
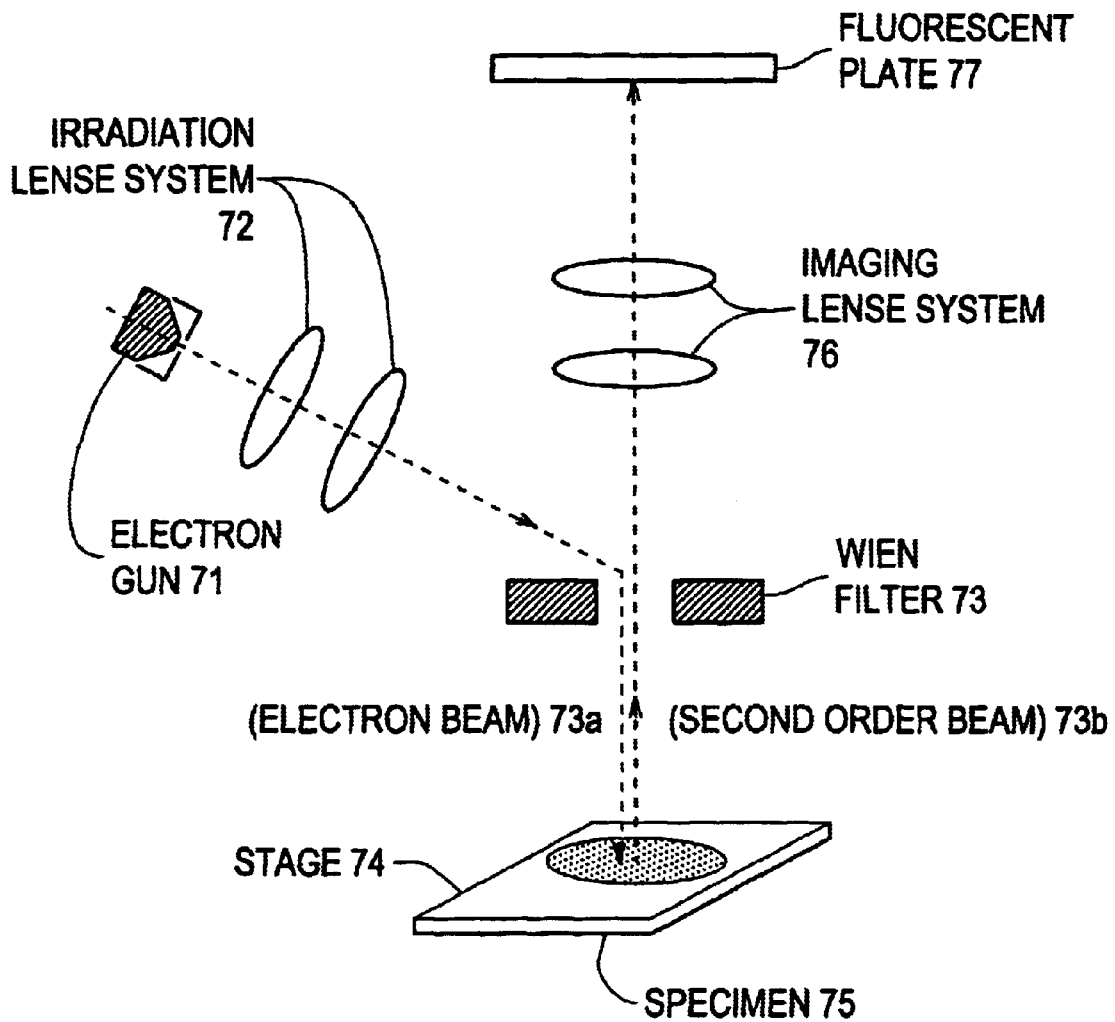
FIG. 16 is a diagram of an exemplary reflecting electron microscope.
Figure 17:
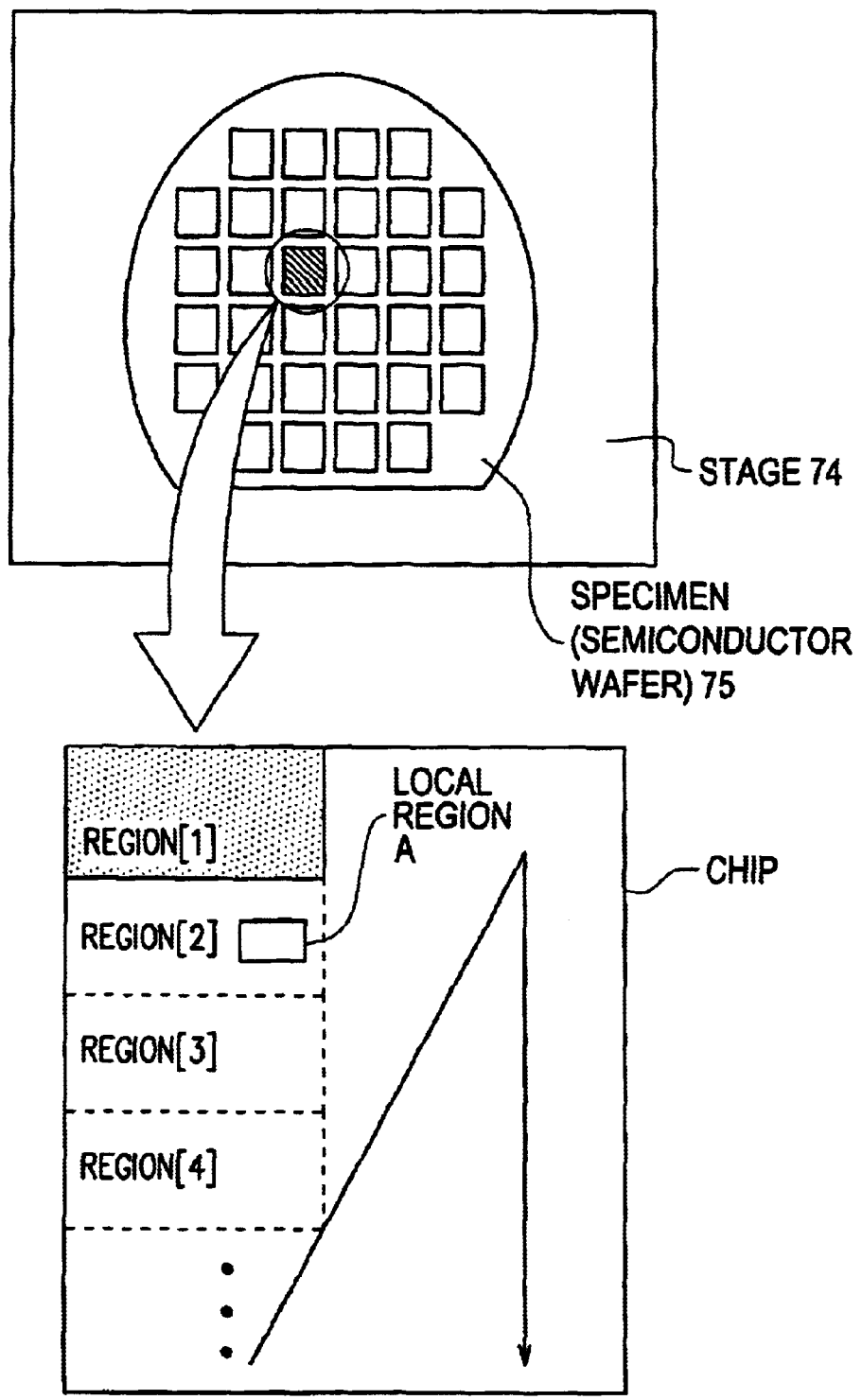
FIG. 17 is a diagram illustrating the imaging operation of a reflecting electron microscope.

Moreover, the above-mentioned rotary unit may be a circular disk as shown in FIG. 15. At this time, the rotation axis 591a (not shown) of the rotary unit 59a is parallel to the optical axis of the relay lens 46; the rotary unit 59a, by a 180° rotation centered on this rotation axis 591a (not shown), can change over either of two sensors to receive incident light.

Furthermore, in FIG. 5, by making the mirror 48a a semi-transparent mirror, it may be constituted to distribute the light from the relay lens 46 to both the TDI array CCD sensor 47 and the two-dimensional CCD sensor 50.

Moreover, in the second embodiment, the scintillator 55 was arranged in the interior of the chamber 23, but there is no limitation to this, and it may be arranged in any position of the interior of the secondary column 22 which may detect secondary electrons and the like.

Moreover, as the array imaging element of the TDI type, other than CCD imaging elements, BBD imaging elements may be used. Moreover, as the two-dimensional imaging element, other than a CCD imaging element, a BBD imaging element or a MOS type imaging element may be used.

As described above, in the scanning device by means of electron beam of the first embodiment, because it is equipped with a so-called TDI type of array imaging element and a two-dimensional imaging element, for example, when acquiring pictures of regions of a wide range, these can be acquired at high speed using the array imaging element, when acquiring pictures of local regions, these can be acquired using the two-dimensional imaging element. Accordingly, using these two and suitably changing them over, the compatibility of high speed and picture quality of the imaging elements can be realized.

In the scanning device by means of electron beam of the first embodiment by means of driving the insertion and removal of a mirror to the light path, an area imaging element and a two-dimensional imaging element can be used, changing them over in a simple manner.

In the scanning device by means of electron beam of the second embodiment it is provided with means which form a specimen picture, causing imaging of the secondary beam by means of an imaging electron optical system, and means which form a specimen picture, scanning by means of a spot beam. Accordingly, for example, in the case of observing the image of a wide area, the former is used, and in the case of observing a local region, the latter is used. In particular, in the case that the local region is extremely small, it is necessary to acquire an enlarged picture, but by scanning with a spot beam, by stopping the beam diameter down, a high precision enlarged picture can be acquired.

In the scanning device by means of electron beam of the first embodiment, because it is equipped with a TDI type of array imaging element and a two-dimensional imaging element, by suitable proper use of these two, the compatibility of speed of the imaging operation and quality of the picture can be realized.

In the scanning device by means of electron beam of the first embodiment, when acquiring pictures of regions of a wide range, imaging at high speed is possible using the TDI type of array imaging element, moreover, when acquiring pictures of defective places, they can be imaged with high precision using the two-dimensional imaging element.

Because the present invention, applied to a scanning device and scanning method by means of an electron beam, can bring about compatibility of speed of the imaging operation and quality of the picture, an increase of scanning speed and an increase in reliability can be provided for.

Next, a third preferred embodiment will be described. The scanning device 10 of the present preferred embodiment is the embodiment shown in FIG. 18.

In the primary column 21 (FIG. 18), a primary column control unit 40 which controls the lens voltage of the primary optical system 25, and a deflector control unit 67 which controls the voltage applied to a primary deflector 26, are connected. These primary column control unit 40 and deflector control unit 67 are connected to a CPU 39.

The deflector 26 (hereinafter, the primary deflector 26) shown in FIG. 18 may be an electrostatic deflector or an electromagnetic deflector. In the third preferred embodiment, as shown in FIG. 40(a), an electrostatic deflector capable of biaxial deflection constituted by 4 independent electrodes 105–108 is used. By causing changes of the applied voltage V1 with respect to axis. Moreover, by causing changes of the applied voltage V1 with respect to electrodes 105, 107, the locus of the primary beam can deflect along the Y axis.

Figure 18:
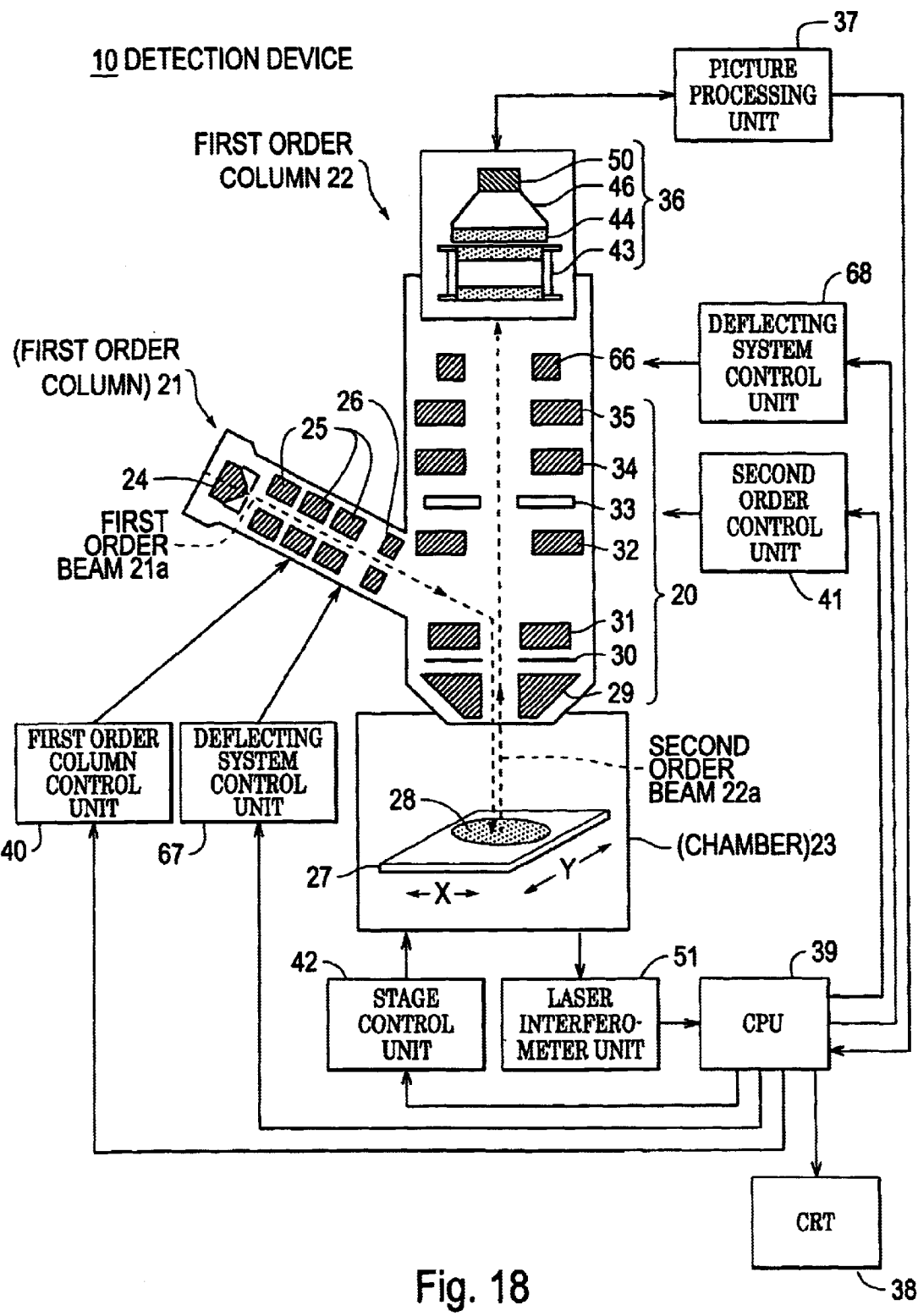
FIG. 18 is a diagram of a scanning device according to a third preferred embodiment of the present invention.

In the interior of the secondary column 22, as shown in FIG. 18, on the optical axis of the secondary beam (as mentioned below) emitted from the specimen 28, cathode lenses 29, aperture stop 33, a Wien filter 31, a second lens 32, secondary field stop 33, a third lens 34, a fourth lens 35, a secondary deflector 66 and a detector 37 are arranged.

This aperture stop 30 is arranged so that its aperture portion is in the focal position of the cathode lens 29. Because of this, the aperture stop 30 and the cathode lens 29 constitute a telecentric electron optical system.

The secondary deflector 66 (FIG. 40(B), similarly to the above-mentioned primary deflector 26, is an electrostatic deflector capable of biaxial deflection constituted by 4 independent electrodes 115–118; by causing changes of the applied voltage V2 with respect to electrodes 116, 118, the locus of the secondary beam can deflect along the X axis. Moreover, by causing changes of the applied voltage V2 with respect to electrodes 115, 117, the locus of the secondary beam can deflect along the Y axis.

Moreover, the detector 36 (FIG. 18) is constituted from the MCP 43 which increases the acceleration of the electrons, and a fluorescent surface 44 which converts the electrons into light, and a FOP (fiber optic plate) 46 having an optical relay lens (not shown in the drawing), and a two-dimensional CCD sensor 50 which images the optical image. The two-dimensional CCD sensor 50 has plural light-receiving pixels in a two-dimensional array. This detector 36 is connected to the picture processing unit 37.

Furthermore, a secondary column control unit 41 which controls the respective lens voltages of the cathode lens 29, second lens 32, third lens 34, and fourth lens 35, and in addition controls the magnetic field applied to the Wien filter 31, and a deflector control unit 68 which controls the voltage applied to the secondary deflector 66, are connected to the secondary column 22. These secondary column control unit 41, deflector control unit 68, and image processing unit 37, are connected to the CPU 39.

Furthermore, a CRT 38 which displays pictures is connected to the CPU 39.

Figure 19:
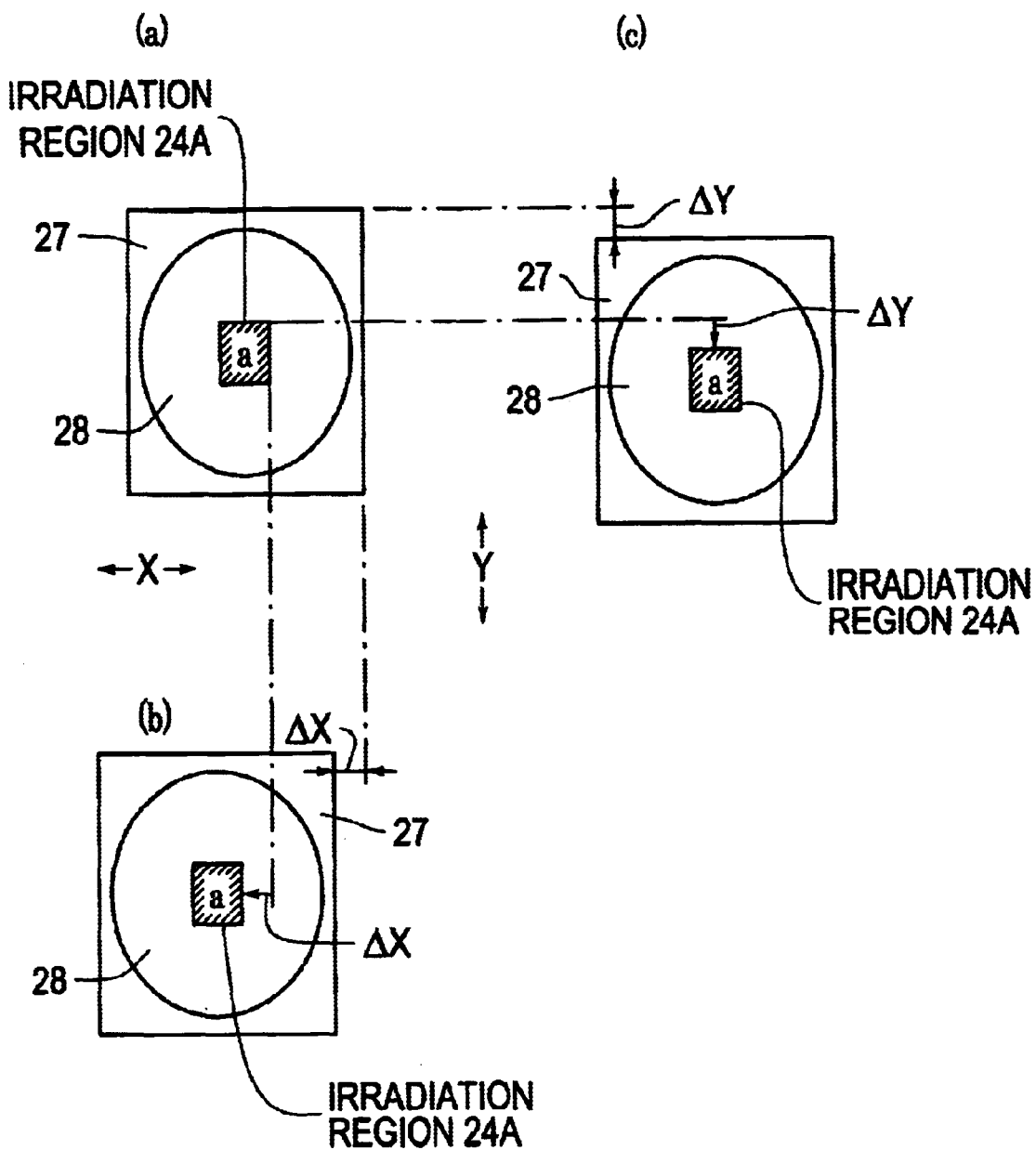
FIG. 19 is a diagram which illustrates the irradiation region of the primary beam of the scanning device shown in FIG. 18.
Figure 25:
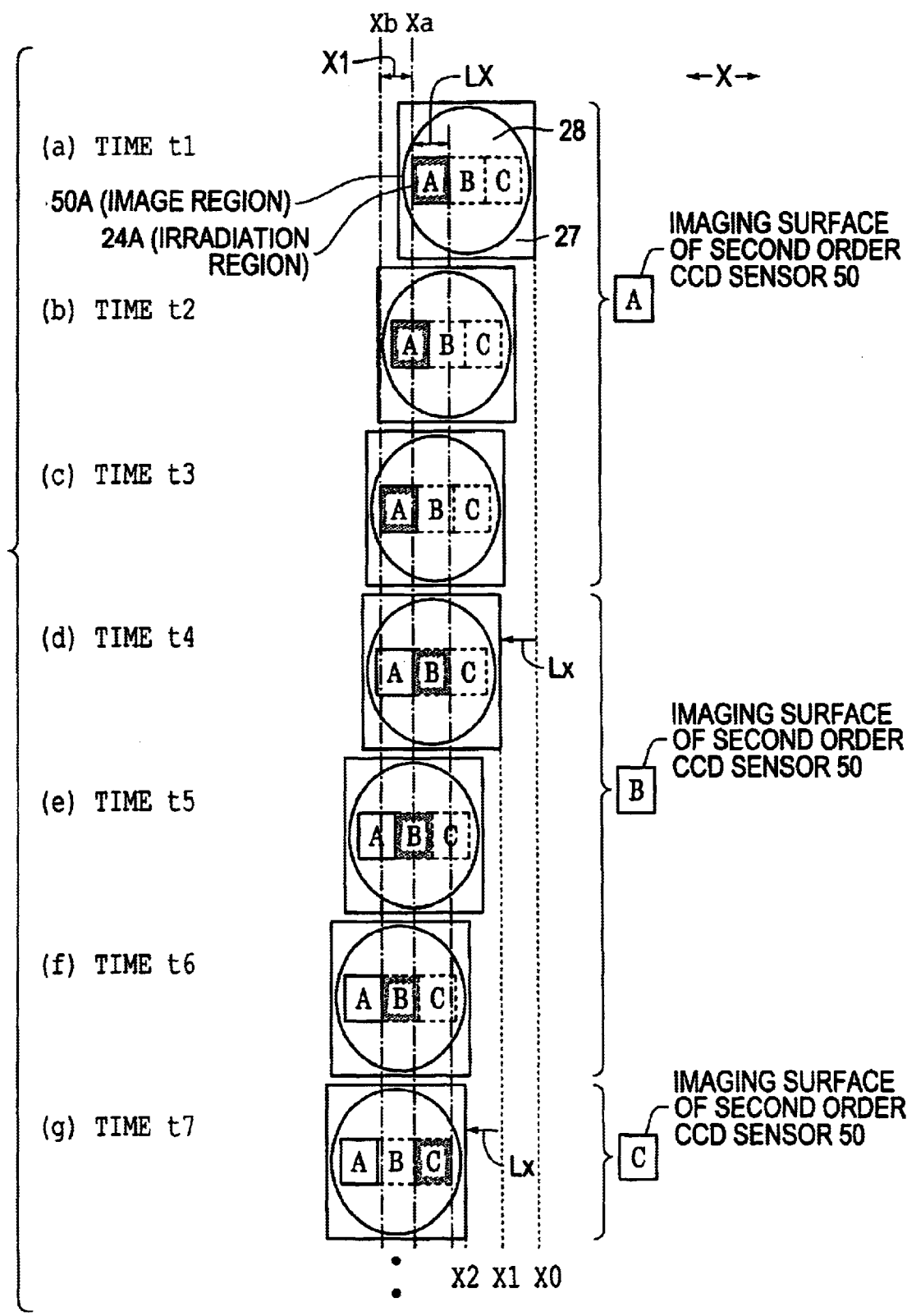
FIG. 25 is a diagram which illustrates the picture acquisition operation of the third preferred embodiment shown in FIG. 18.

An irradiation region 24A in FIG. 25 of the primary beam on the specimen 28 surface is shaped by controlling the lens voltage to the primary optical system 25, and it becomes an about rectangular shape in this third embodiment, as shown in FIG. 19(a). This is in order to cause correspondence with the shape of the imaging surface of the two-dimensional CCD sensor 50 (FIG. 18).

Furthermore, the position of the irradiation region 24A of the primary beam can be moved in the XY directions on the specimen 28 surface, by deflecting the locus of the primary beam in the XY directions by means of control of the applied voltage V1 to the primary deflector 26.

The movement of this irradiation region 24A, in the present embodiment, is performed synchronously with the movement of the specimen 28 accompanying the movement of the stage 27.

Namely, when the stage 27 moves, the laser interferometer unit 51 (FIG. 18) detects the direction of movement and the amount of movement of the stage 27, and outputs a stage movement signal to the CPU 39 according to the result of this detection. The CPU 39, synchronizing with the stage movement signal from the laser interferometer unit 51, controls the deflector control unit 67, and causes the voltage V1 applied to the primary deflector 26 to change.

For example, in the case that the stage 27 moved by an amount of movement ΔX along the X axis as shown in FIG. 19(b), the deflector control unit 47 (FIG. 18) causes a change of the voltage V1 applied to the electrodes 106, 108 (FIG. 40(a) of the primary deflector 26 (FIG. 18). As a result, the locus of the primary beam deflects along the X axis, and the irradiation region 24A of the primary beam on the specimen 28, as shown in FIG. 19(b), comes to move by ΔX following the movement amount ΔX of the stage 27.

Moreover, in the case that the stage 27 moved by an amount of movement ΔY along the Y axis as shown in FIG. 19(c), the deflector control unit 67 (FIG. 18) causes a change of the voltage V1 applied to the electrodes 105, 107 (FIG. 40B)) of the primary deflector 26 (FIG. 18). As a result, the locus of the primary beam deflects along the Y axis, and the irradiation region 24A of the primary beam on the specimen 28, as shown in FIG. 19(c), comes to move by ΔY following the movement amount ΔY of the stage 27.

In this manner, the irradiation of the primary beam can be kept to the predetermined region a of the specimen 28 by means of causing the irradiation region 24A of the primary beam to move, causing synchronism with the movement of the specimen 28 accompanying the movement of the stage 27.

On the other hand, when the primary beam is irradiated on the specimen 28, a secondary beam is emitted which consists of at least one kind among secondary electrons, reflected electrons, or back-scattered electrons.

This secondary beam has two-dimensional picture information of the irradiation region 24A. Moreover, because the above-mentioned primary beam was irradiated perpendicularly with respect to the specimen 28, the secondary beam comes to have a clear image without shadows.

Figure 20:
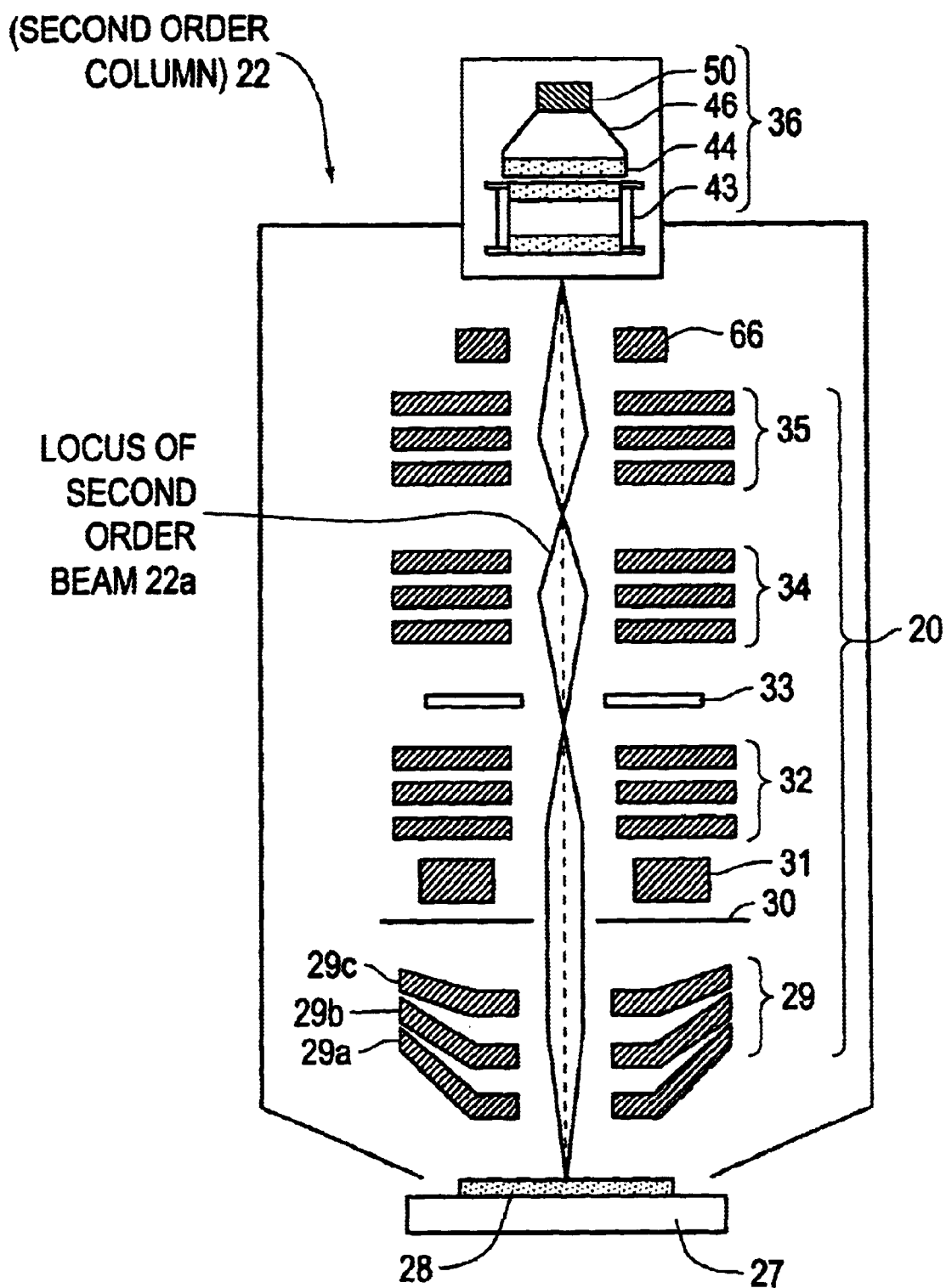
FIG. 20 is a diagram showing the locus of the secondary beam.

Here, because the above-mentioned retarding voltage is applied to the stage 27 by which the specimen 28 was located, an electric field which is positive with respect to the secondary beam is formed between the electrode 29a of the cathode lens 29 shown in FIG. 20 and the specimen 28 surface. Accordingly, the secondary beam which was emitted from the specimen 28 is accelerated toward the cathode lens 29, and passes with good efficiency into the visual field of the secondary optical system 20.

The secondary beam emitted from the specimen 28 and imaged in the detection surface of the detector 36 is accelerated and magnified while passing through the MCP 43 in the detector 36, and is converted into light by the fluorescent plate 44. Then, the light from the fluorescent plate 44 is imaged via the FOP 46 on the imaging surface of the two-dimensional CCD sensor 50.

Furthermore, the third lens 34 and fourth lens 35 are lenses in order to enlarge and project the intermediate image which was obtained on the secondary field stop 33. Accordingly, the secondary image of the irradiation region 24A on the specimen 28 surface is enlarged and projected to the detection surface of the detector 36.

Moreover, the secondary image of the irradiation region 24A, enlarged and projected on the detection surface of the detector 36 (secondary image), after being converted to an optical image in the fluorescent surface 44, is projected via the FOP 46 onto the imaging surface of the two-dimensional CCD sensor 50. In this connection, the FOP 46, in order to match the image size on the fluorescent surface 44 and the image size on the two-dimensional CCD sensor 50, projects the optical image, reducing to about ⅓.

Figure 21:
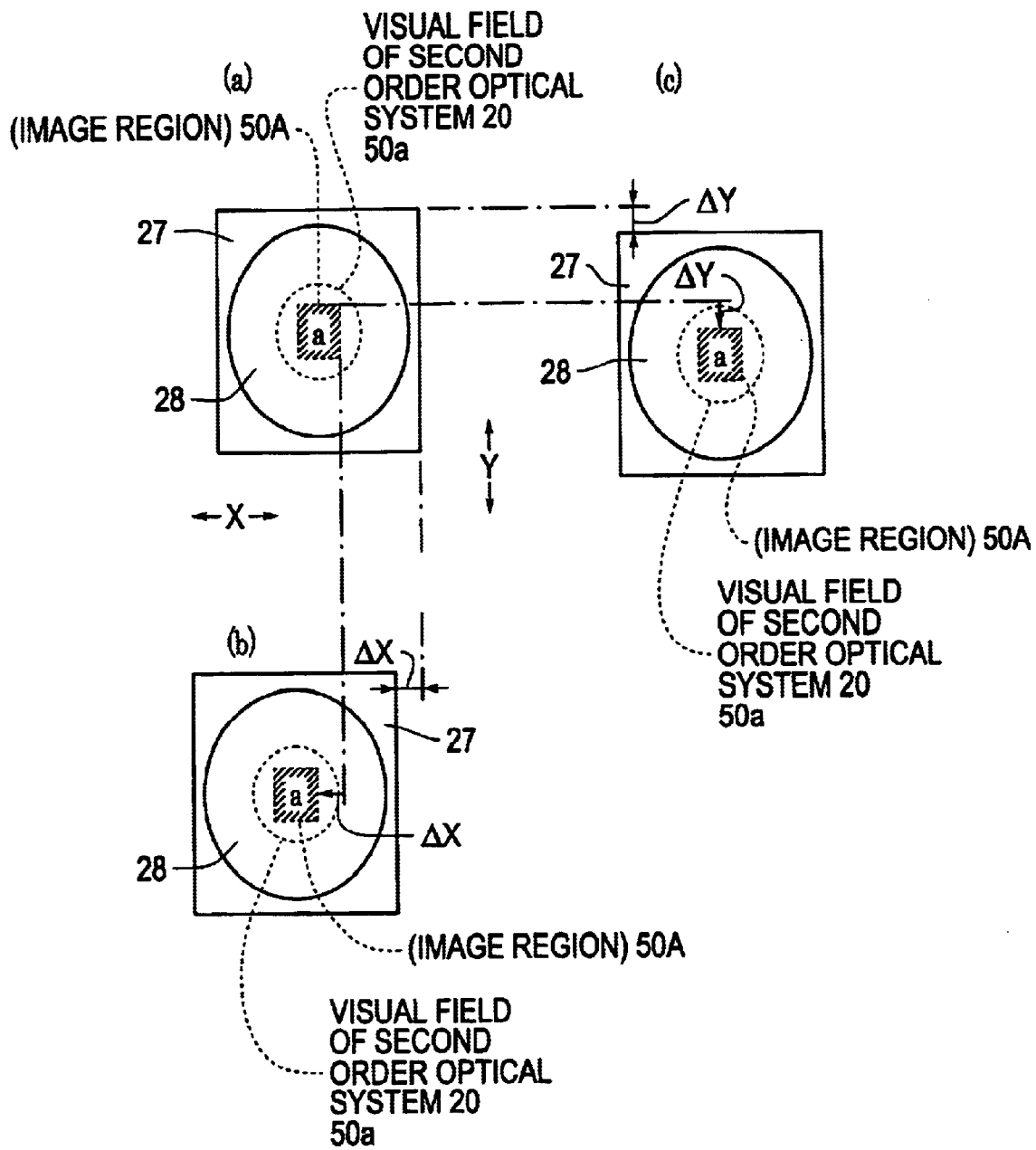
FIG. 21 is a diagram which illustrates the imaging region.

Here, a region on the surface of the specimen 28 which corresponds to the imaging surface of the two-dimensional CCD sensor 50 is said to be the imaging region 50A (see FIG. 21(a)), and according to the shape of the imaging surface of the two-dimensional CCD sensor 50, becomes of an about rectangular shape.

However, the position of this imaging region 50A, by the deflection in the XY directions on the specimen 28 surface, deflects the locus of the secondary beam in the XY directions by means of the voltage V2 applied to the secondary deflector 66.

The movement of this imaging region 50A, in the first embodiment, is performed synchronously with the movement of the specimen 28 accompanying the movement of the stage 27.

Namely, similarly to the case of the irradiation region 24A of the above-mentioned primary beam, the CPU 39 (FIG. 18), synchronizing with the stage movement signal from the laser interferometer unit 51, controls the deflector control unit 68, causing a change of the voltage V2 applied to the secondary deflector 66.

For example, in the case that the stage 27 moved by a movement amount $\Delta X$ along the X axis such as shown in FIG. 21(b), the voltage V2 applied to the electrodes 116, 118 (FIG. 40(b)) is caused to change. As a result, the locus of the secondary beam is deflected along the X axis, and the irradiation region 50A on the specimen 28 comes to move by $\Delta X$, following the movement amount $\Delta X$ of the stage 27.

Moreover, in the case that the stage 27 moved by a movement amount $\Delta Y$ along the Y axis such as shown in FIG. 21(c), the voltage V2 applied to the electrodes 115, 117 (FIG. 40(b)) is caused to change. As a result, the locus of the secondary beam is deflected along the Y axis, and the irradiation region 50A on the specimen 28 comes to move by $\Delta Y$, following the movement amount $\Delta Y$ of the stage 27.

In this manner, the predetermined region a of the specimen 28 and the two-dimensional CCD sensor can be kept in a corresponding relationship by means of causing the imaging region 50A to move, causing synchronism with the movement of the specimen 28 accompanying the movement of the stage 27.

On the other hand, the optical image of the imaging region 41A projected on the imaging surface of the two-dimensional CCD sensor 50, photo-electrically converted in the two-dimensional CCD sensor 50, the obtained signal electric charge, for example, is output at intervals of ⅟₃₀ second to the picture processing unit 37 (FIG. 18). The image processing unit 37, after A/D conversion of the electric charge from the two-dimensional CCD sensor 50, prepares picture information stored in internal VRAM, and outputs to the CPU 39. The CPU 39 causes a display on the CRT 38 of a picture corresponding to the imaging region 50A of the specimen 28. Moreover, the CPU 39, by carrying out template matching and the like with regard to the picture information, specifies defective places of the specimen.

Next, a description will be given, using FIGS. 22–25, regarding the operation while acquiring picture information of the specimen 28 as the stage 27 is moving at a constant speed, in the scanning device 10 of the above-mentioned third embodiment.

Here for easy comprehension, the description is of the case in which the stage moves at a constant speed along the X axis.

Furthermore, in the third embodiment, the irradiation region 24A (FIG. 19) of the primary beam as mentioned above, is shaped in about the same shape as the imaging region 50A (FIG. 21), and in addition, the movement of the irradiation region 24A of the primary beam and the movement of the imaging region 50A (FIG. 21) along the X axis are synchronously controlled.

Accordingly, the irradiation region 24A of the primary beam and the imaging region 50A are normally maintained in a superposed state on the surface of the specimen 28 (the cross-hatching portion in FIG. 25(a)–(g) shows the overlap of the irradiation region 24A and the imaging region 50A).

Here, a specific description is given regarding the voltage V2 (FIG. 23) to the secondary deflector 66 and the voltage V1 (FIG. 22) applied to the primary deflector 26, during the synchronous control of the movement of the irradiation region 24A and the movement of the imaging region 50A. Furthermore, in FIGS. 22 and 23, the right-hand ordinate shows in combination the position of the irradiation region 24A, and the position of the imaging region 50A.

The voltage V1 (FIG. 22) applied to the primary deflector 26, decreases in constant proportion from a maximum value +V11 to a minimum value −V12, a period TD (instants t1–t3, t4–t6, . . . ), and increases in a constant proportion from a minimum value −V12 to a maximum value +V11, a period TU (instants t3–t4, t6–t7, . . . ), is alternately repeated, and change periodically (period T).

Figure 22:
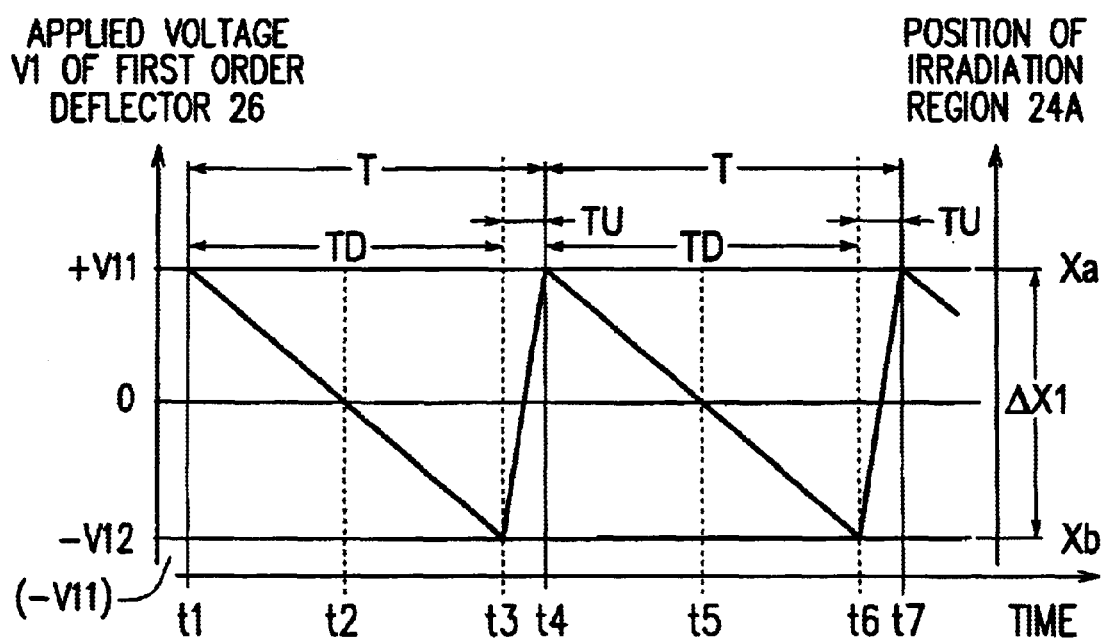
FIG. 22 is a diagram showing the voltage applied to the primary deflector in the third preferred embodiment shown in FIG. 18.

Among such periodic changes, in the instants t1, t4, t7 . . . when the applied voltage V1 is at the maximum value +V11, the irradiation region 24A, as shown on the right-hand ordinate of FIG. 22 is positioned at the point Xa (FIGS. 25(a), (d), (g)). Moreover, in the instants t3, t6, . . . when the applied voltage V1 is at the minimum value −V12, the irradiation region 24A, as shown on the right-hand ordinate of FIG. 22, is positioned at the point Xb (FIGS. 25(c), (f)).

Furthermore, in the period TD in which the voltage V1 decreases in a constant proportion, the irradiation region 24A moves at a constant speed toward the point Xb from the point Xa. Moreover, in the period TU in which the voltage V1 increases in a constant proportion, the irradiation region 24A moves at a constant speed toward the point Xa from the point Xb.

On the other hand, the voltage V2 (FIG. 23) applied to the secondary deflector 66, decreases in constant proportion from a maximum value +V21 to a minimum value −V22, a period TD (instants t1–t3, t4–t6, . . . ), and increases in a constant proportion from a minimum value −V22 to a maximum value +V21, a period TU (instants t3–t4, t6–t7, . . . ), is alternately repeated, and change periodically (period T).

Among such periodic changes, in the instants t1, t4, t7 . . . when the applied voltage V2 is at the maximum value +V21, the imaging region 50A is positioned at the same point Xa (FIGS. 25(a), (d), (g)) as the above-mentioned irradiation region 24A. Moreover, in the instants t3, t6, . . . when the applied voltage V1 is at the minimum value −V22, the imaging region 50A is positioned at the point Xb (FIGS. 25(c), (f)) as the irradiation region 24A.

Furthermore, in the period TD in which the applied voltage V2 decreases in a constant proportion, the imaging region 50A, similarly to the above-mentioned irradiation region 24A, moves at a constant speed from the point Xa toward the point Xb. Moreover, in the period TU in which the applied voltage V2 increases in a constant proportion, the imaging region 50A, similarly to the above-mentioned irradiation region 24A, moves at a constant speed from the point Xb toward the point Xa.

In this manner, the irradiation region 24A and the imaging region 50A, while normally being maintained in a superposed state, come to move periodically in a reciprocating movement between the point Xa and the point Xb. At this time the movement range ΔX1 of the irradiation region 24A and the imaging region 50A is about equal to the length Lx (see FIG. 25(a)) of the imaging region 50A along the X axis.

Furthermore, in the present preferred embodiment, among the reciprocating movements of the above-mentioned irradiation region 24A and imaging region 50A (FIGS. 22 and 23), movement from the point Xa toward the point Ab in the period TD, causes this movements to be synchronized with the movements of the stage 27. Because of this, the irradiation region 24A and imaging region 50A in addition at the same speed as the speed Vx of the stage 27, and in the same direction as the movement direction of the stage 27, come to move in the direction from the point Xa to the point Xb.

Moreover, because the speed Vx and the movement direction of the stage 27 are constant, in the period TU when the irradiation region 24A and imaging region 50A move from the point Xb toward the point Xa, the movement of the irradiation region 24A and the imaging region 50A is in the reverse direction to the direction of movement of the stage 27, and becomes no longer synchronized with the movement of the stage 27. Then, the movement of the irradiation region 24A and the imaging region 50A in this period TU is performed at a high speed.

However, the period T (for example, 1 second) of the reciprocating movement of the irradiation region 24A and imaging region 50A, in the third embodiment, is determined to be the time (Lx/Nx) taken for the stage 27 (speed Vx) to cover the length Lx (see FIG. 25(a)) of the above-mentioned imaging region 50A.

Figure 24:
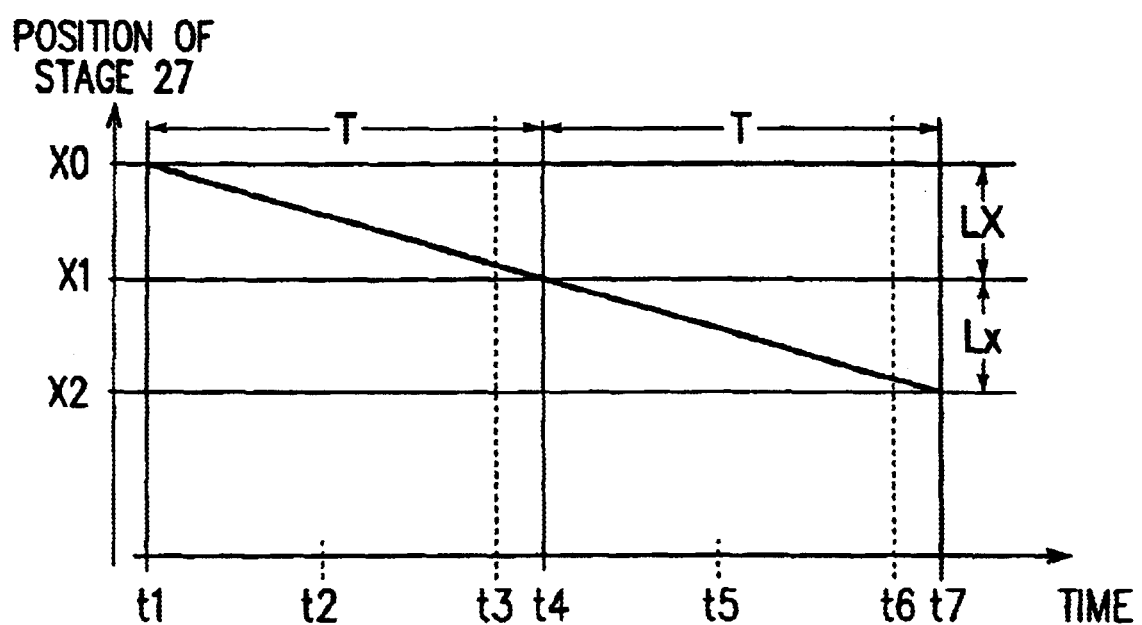
FIG. 24 is a diagram showing the movement of the stage in the third preferred embodiment shown in FIG. 18.

Accordingly, the stage 27 moves by the length Lx according to the time T for 1 period which elapses. Namely, as shown in FIG. 24, the stage 27 (see also FIG. 25(a)) positioned at the point X0 at the instant t1, at the time t4 after 1 period, moves to the point X1 separated by the length Lx (see FIG. 24(d)), and at instant t7 when 1 further period has elapsed, moves to a point X2 separated by a further Lx (see FIG. 25(g)).

By means of the above-mentioned controlled irradiation region 24A, imaging region 50A, stage 27, the picture information of the specimen 28 positioned on the stage 27 is acquired as follows.

Firstly, at the instant t1 (FIG. 25(a)), the stage 27 is positioned at the point X0; the irradiation region and the imaging region 50A are positioned at the point Xa. Because of this, the image of the detection region A positioned in the point Xa is projected in the imaging plane of the two-dimensional CCD sensor 50.

Then, the period TD (FIG. 25(a)–(c)) from instant t1 to instant t3, with the irradiation region 24A, imaging region 50A and stage 27 moving synchronously from the point Xa toward the point Xb, track the scanning region A of the specimen 28. Accordingly, the image of the scanning region A is projected in a stationary state in the image plane of the two-dimensional CCD sensor 50. The image of this scanning region A is read out at intervals of 1/30 second. The stationary picture of the scanning region A is displayed on the CRT 38, at about 1 second intervals (corresponding to the period T).

Moreover, in the period TU of instant t3-instant t4 (FIG. 25(d)), the irradiation region 24A and imaging region 50A move at high speed in the reverse direction (to the right in the Figure) to the direction of movement of the stage 27 (to the left in the Figure).

Then, at the instant t4 (FIG. 25(d)), the stage 27, positioned at the point X1 separated by Lx from the point X0, the irradiation region 24A and the imaging region 50A again return to the point Xa. Because of this, the image of the scanning region B is projected positioned in the point Xa in the image plane of the two-dimensional CCD sensor 50. Furthermore, this scanning region B is adjacent to the above-mentioned scanning region A.

Moreover, the period TD (FIG. 25(d)–(f)) of instant t4 to instant t6, with the irradiation region 24A, imaging region 50A and stage 27 moving synchronously from the point Xa toward the point Xb, track the scanning region B of the specimen 28. Accordingly, the image of the scanning region B is projected in a stationary state in the image plane of the two-dimensional CCD sensor 50. The image of this scanning region B is read out similarly to the above-mentioned, and a stationary image of the scanning region B is displayed on the CRT 38.

Moreover, the period TD of instant t6 to instant t7 (FIG. 25(f)–(g)), the irradiation region 24A and imaging region 50A move at high speed in the reverse direction (to the right in the Figure) to the direction of movement of the stage 27 (to the left in the Figure).

Then, at the instant t7 (FIG. 25(*g*)), the stage 27 is positioned at the point X2 separated by Lx from the point X1, the irradiation region 24A and the imaging region 50A again return to the point Xa. Because of this, the image of the scanning region C is projected positioned in the point Xa in the image plane of the two-dimensional CCD sensor 50. Furthermore, this scanning region C is adjacent to the above-mentioned scanning region B.

Thereafter, similarly to the case of the scanning region A and the scanning region B, the image of the scanning region C is projected in a stationary state on the imaging surface of the two-dimensional CCD sensor 50. The image of this scanning region C is read out similarly to the above-mentioned, and a stationary picture of the scanning region C is displayed on the CRT 38.

In this manner, in the case that the stage 27 moves along the X axis, by means of causing the irradiation region 24A and the imaging region 50A to move reciprocatingly along the X axis, specimen pictures can be continuously acquired from the regions A, B and C which are adjacently arranged along the X axis.

Moreover, by means of the scanning device 10, not only in the case in which the stage 27 moves along the X axis, but also cases in which the stage 27 moves along the Y axis, by means of causing the irradiation region 24A and the imaging region 50A to move reciprocatingly along the Y axis, specimen pictures can be continuously acquired from the regions adjacently arranged along the Y axis.

Figure 26:
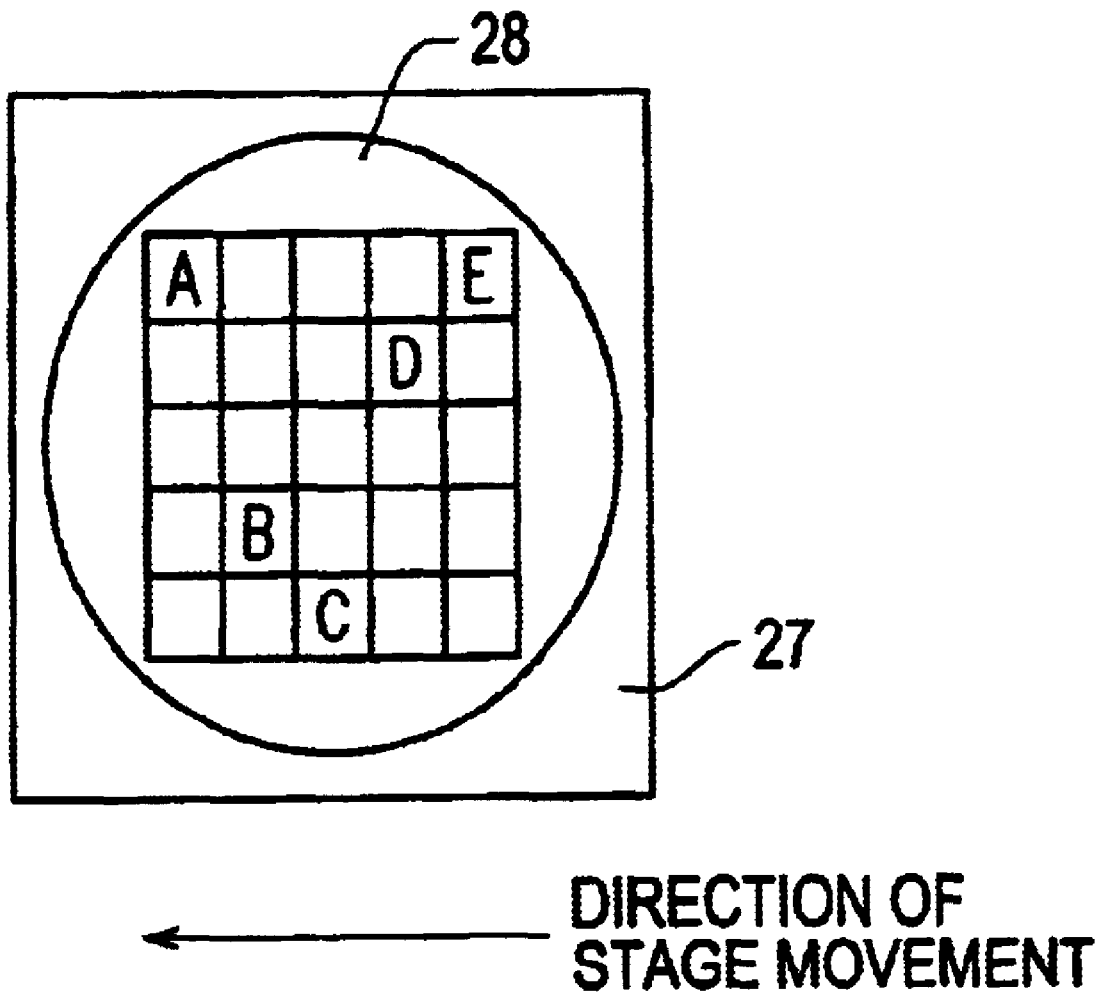
FIG. 26 is a diagram showing plural scanning regions A–E arranged in zigzag form.

Furthermore, by means of the scanning device 10, not only plural adjacent scanning regions (for example, FIGS. 25(*a*)–(*c*)) along the movement direction of the stage 27 as described above, but as shown in FIG. 26, specimen pictures can also be continuously acquired from plural scanning regions A, B, C, D, E in a zigzag form other than the movement direction of the stage 27.

In this case, during the acquisition of stationary pictures of each scanning region A, B, C, D, E, similarly to the above-mentioned operation (see instants t1–t3, t4–t6, . . . of FIGS. 22–25), the movement of the stage 27, and the movement of the irradiation region 24A and of the imaging region 50A are caused to be synchronous.

Then, after the acquisition of a stationary picture from some scanning region (A, for example), the irradiation region 24A and the imaging region 50A are caused to move at high speed in the reverse direction (to the right in the Figure) to the movement direction (to the left in the Figure) of the stage 27, and by also causing high speed movement in a direction (up or down in the Figure) at right angles to the movement direction of the stage 27, acquisition can be commenced of a picture of the next scanning region (B, for example) separated from some scanning region (A, for example).

Furthermore, the amount of movement of the irradiation region 24A and the imaging region 50A at the time of high speed movement is determined in advance according to the positional relationship of a given scanning region (A, for example) and the next scanning region (B, for example).

In this manner, by means of the alternate repetition of periods when the irradiation region 24A and the imaging region 50A are caused to move synchronously in the movement direction of the stage 27, and periods in which the irradiation region 24A and the imaging region 50A are caused to move at high speed according to the positional relationship of the scanning regions, specimen pictures can be continuously acquired from scanning regions A, B, C, D, E which are arranged in a zigzag form and not mutually adjacent.

Figure 27:
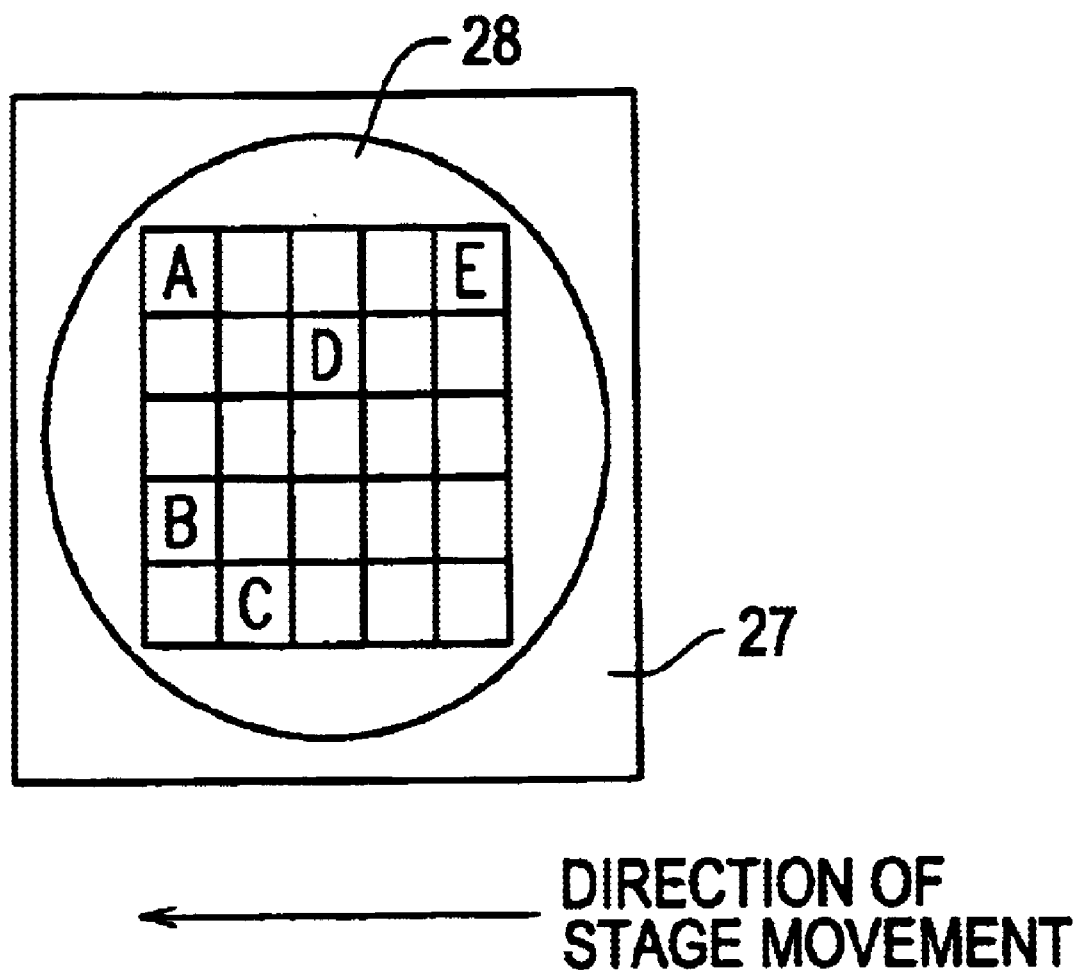
FIG. 27 is a diagram showing a different arrangement of plural scanning regions A–E.

Furthermore, by means of the scanning device 10, for example as in FIG. 27, specimen pictures can be continuously acquired even from scanning regions A, B which are arranged along a direction at right angles to the direction of movement of the stage 27. In this case, the high speed movement of the irradiation region 24A and the imaging region 50A to the scanning region B from the scanning region A is performed in a direction at right angles to the direction of movement of the stage 27.

Figure 28:
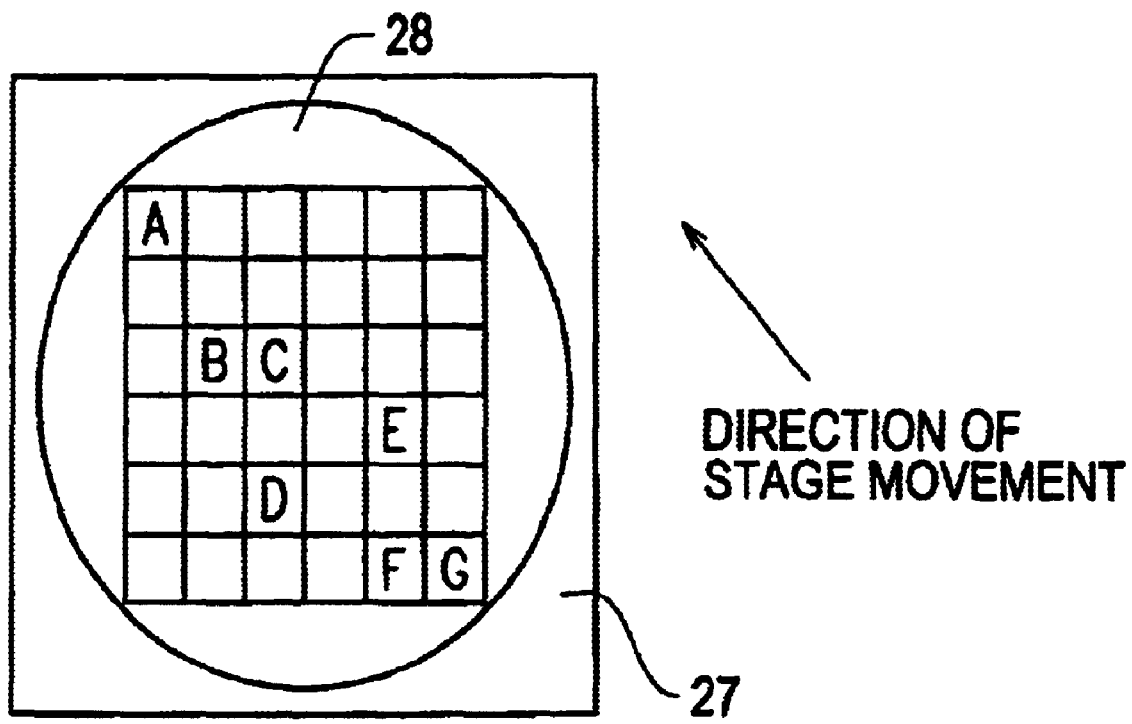
FIG. 28 is a diagram showing an arrangement of plural scanning regions A–G along an oblique direction.

Moreover, by means of the scanning device 10, for example as in FIG. 28, even in the case in which the stage 27 moves in an oblique direction, by means of causing the irradiation region 24A and the imaging region 50A to move synchronously along the movement direction of the stage, stationary pictures can be respectively acquired from plural scanning regions A–G. Then, by causing the irradiation region 24A and the imaging region 50A to move at high speed from a scanning region (A, for example) to the next scanning region (B, for example) according to their positional relationship, stationary pictures can be continuously acquired from each of scanning regions A–G.

By means of the scanning device 10, in the third embodiment as described above, regardless of the movement direction of the stage 27 or the scanning region of the specimen 28, the acquisition of stationary pictures form the respective scanning regions can be continuously performed, and increased scanning efficiency is provided for.

Figure 29:
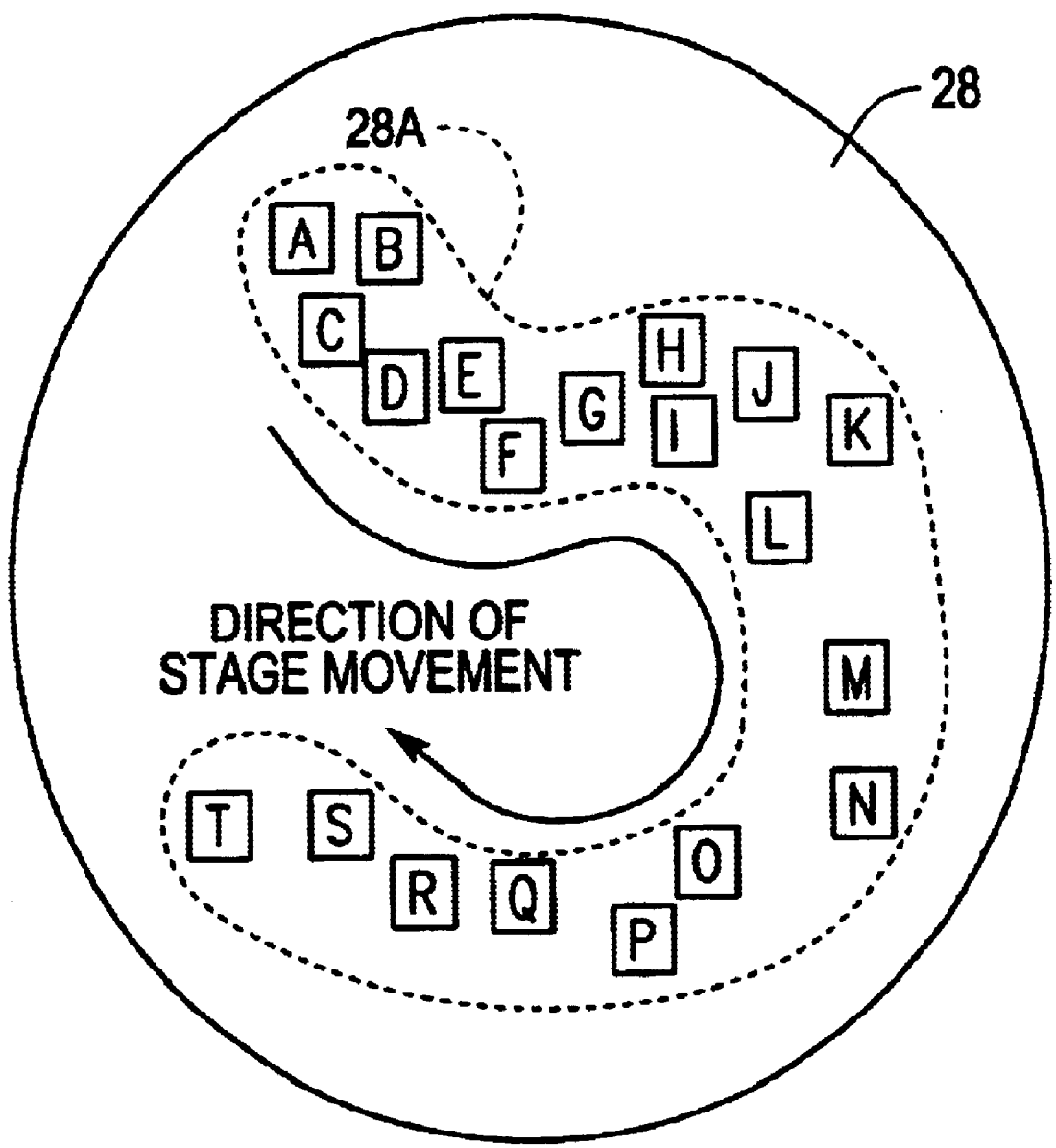
FIG. 29 is a diagram showing a scattered arrangement of plural scanning regions A–T.

Accordingly, as in FIG. 29, in the case that stationary pictures were continuously acquired from plural scanning regions A–T arranged in a scattered way in a partial region 28A of the specimen 28, setting the most efficient movement curve of the stage 27 according to the arrangement of the scanning regions A–T, by causing the stage 27 to smoothly move along this movement curve, picture acquisition can be rapidly performed.

In this manner, because there are no limitations on the scanning direction of the specimen 28 positioned on the stage 27, it becomes a scanning device whose degree of freedom of scanning is wide, and in addition the convenience of use is good.

The scanning device of the third embodiment is not limited to scanning the whole surface of the specimen 28, review of the scanning results and the like, is also effective in a case of scanning a portion of the specimen 28 at a comparatively high magnification, and can scan with good efficiency.

Moreover, in acquiring pictures of each scanning region of the specimen 28 while moving the stage 27, without causing the stage 27 to stop, a period corresponding to the above-mentioned period T (for example, 1 second), stationary pictures can be displayed in real time according to the scanning region which the imaging region 50A, irradiation region 24A are in the course of tracking. Accordingly, it is very effective in a case in which the operator wishes to visually observe the specimen pictures of the scanning regions.

Furthermore in the above-mentioned third embodiment, the shape of the irradiation region 24A, shaping according to the shape of the imaging surface of the two-dimensional CCD sensor 50, because shaped about the same as the imaging region 50A, is irradiated with a primary beam only in the region of the specimen 28 necessary for picture acquisition. Moreover, it can also contribute to preventing charging up and contamination of the specimen 28.

A fourth preferred embodiment is next described. This embodiment differs from the scanning device shown in FIG. 18 in the mode of operation of picture acquisition.

Here also for easy understanding of the description the case in which the stage moves along an X scanning axis is described as an example.

Moreover, in this fourth embodiment also, the irradiation region 24A (FIG. 19) of the primary beam is shaped to the same shape as the imaging region 50A (FIG. 21), and in addition, the movement of the irradiation region 24A and the movement of the imaging region 50A are synchronously controlled along the X axis.

Accordingly, the irradiation region 24A and the imaging region 50A are normally maintained in a superposed state on the surface of the specimen 28 (the superposition of the irradiation region 24A and the imaging region 50A is shown in the cross hatched portion in FIG. 33(a)–(e)).

Figure 33:
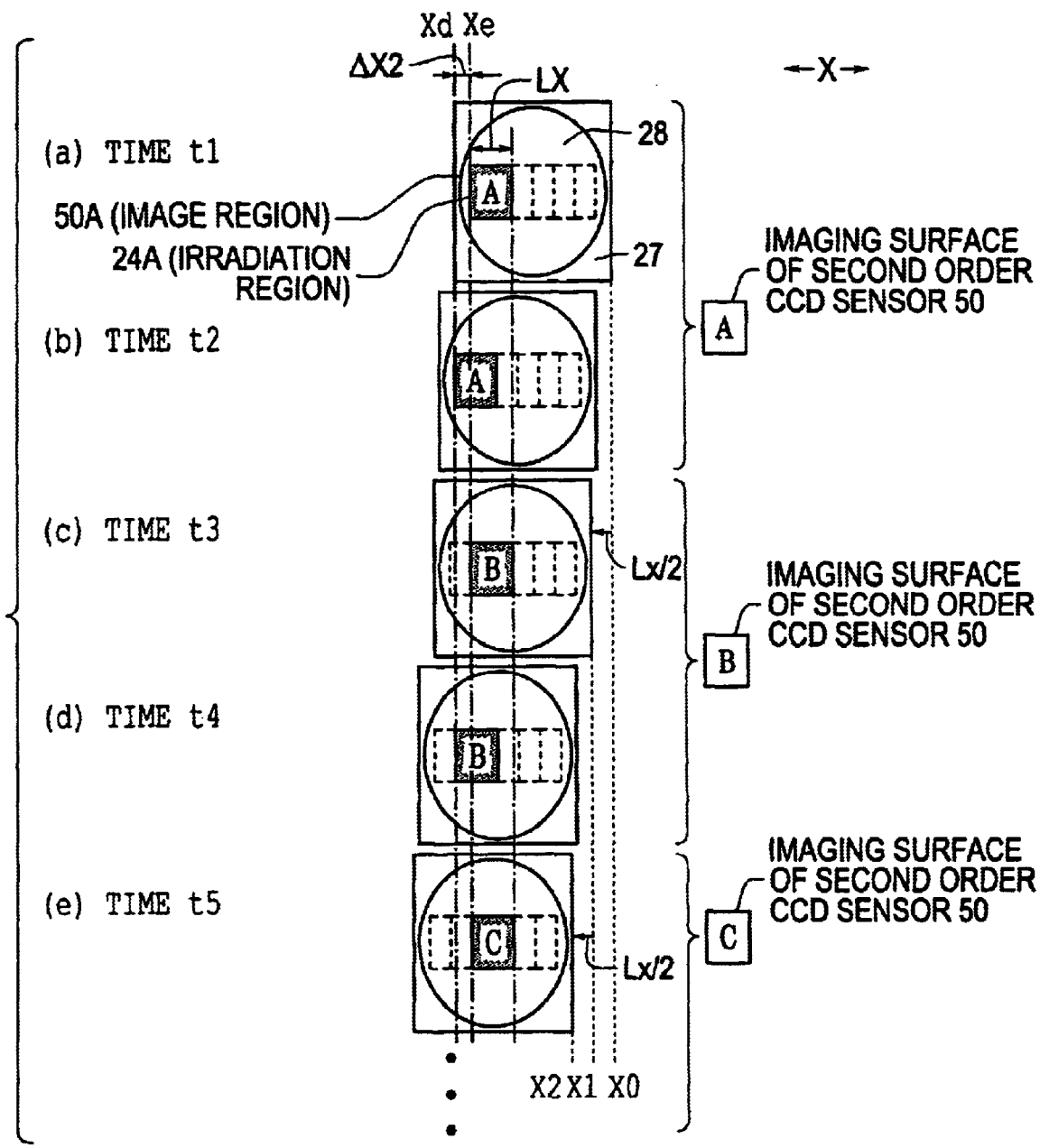
FIG. 33 is a diagram which illustrates the picture acquisition operation of the fourth preferred embodiment of the present invention.

Then, in the picture acquisition operation of the fourth embodiment, the range ΔX2 (FIGS. 30, 31) of the reciprocating motion of the irradiation region 24A and imaging region 50A, is narrower than the movement range ΔX1 (FIGS. 22, 23) of the above-mentioned third embodiment, chiefly characterized by the point that the length Lx of the imaging region 50A becomes about half (see FIG. 33(a)).

Because of this, the maximum voltage V13, minimum voltage −V14 of the voltage V1 (FIG. 30) applied to the primary deflector 26 is set to ½ of the maximum voltage V11, minimum voltage −V12 (FIG. 22) of the above-mentioned third embodiment. Moreover, the maximum voltage V23, minimum voltage −V24 of the voltage V2 (FIG. 31) applied to the primary deflector 26 are set to ½ of the maximum voltage V21, minimum voltage −V22 (FIG. 23) of the above-mentioned third embodiment.

Furthermore, at the instants t1, t3, t5 . . . in which the voltage V1 applied to the primary deflector 26 is a maximum, the voltage V2 applied to the secondary deflector 66 also becomes a maximum value +V23. Then, the irradiation region 24A and the imaging region 50A are both positioned at the point Xc.

Moreover, at the instants t2, t4, . . . in which the voltage V2 applied to the primary deflector 26 is a minimum, the voltage V2 applied to the secondary deflector 66 also becomes a minimum value −V24. Then, the irradiation region 24A and the imaging region 50A are both positioned at the point Xd.

Furthermore, in the period TD (instants t1–t2, t3–t4, . . . ) in which the applied voltages decrease in a constant proportion, the irradiation region 24A and the imaging region 50A move at a constant speed in a superposed state from the point Xc toward the point Xd. At this time, the movement is synchronized with the movement of the stage 27.

Moreover, in the period TU (instants t2–t3, t4–t5, . . . ), the irradiation region 24A and the imaging region 50A move at a constant speed in a superposed state from the point Xd toward the point Xc. At this time, the movement is not synchronized with the movement of the stage 27.

Furthermore, in the picture acquisition operation of the fourth embodiment, the period K of the reciprocating movement of the irradiation region 24A and the imaging region 50A is defined as the time (Lx/(2Vx)) taken for the stage 27 to move half (Lx/2) of the length Lx of the imaging region 50A.

Figure 32:
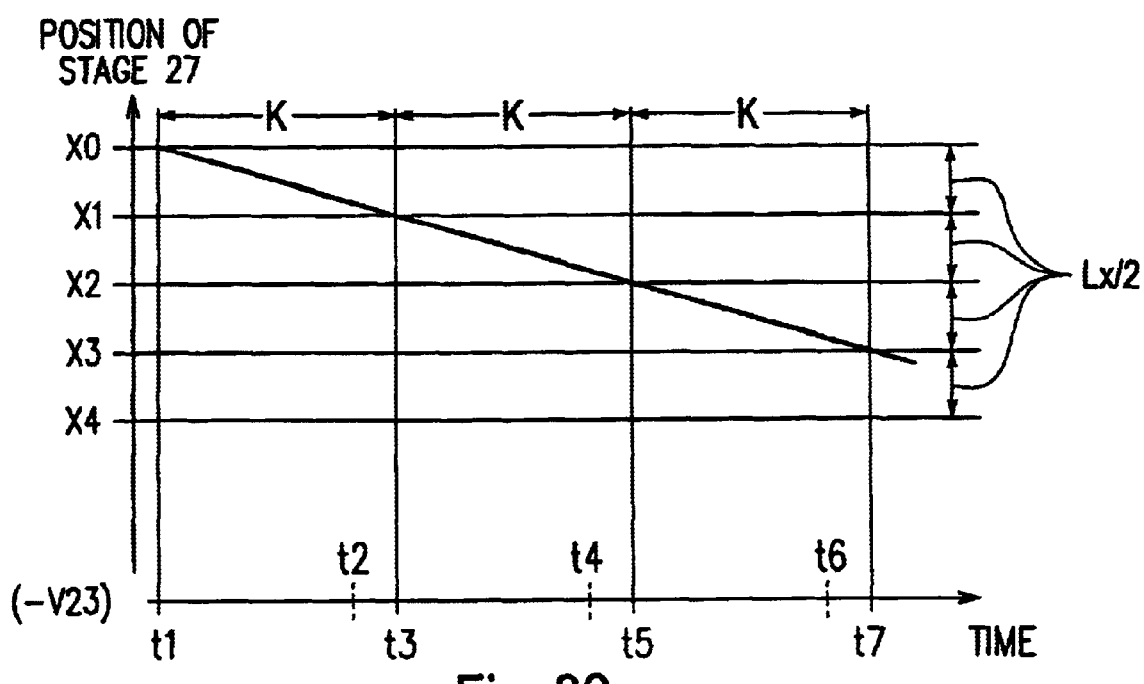
FIG. 32 is a diagram showing the movement of the stage in the fourth preferred embodiment shown in FIG. 30.

Accordingly, the stage 27, as shown in FIG. 32, when the time K of 1 period elapses, comes to move by the length Lx/2.

By means of the above-mentioned control of the irradiation region 24A, imaging region 50A and stage 27, the picture information of the specimen 28 positioned on the stage 27 is acquired as follows.

Firstly, at the instant t1 (FIG. 33(a)), the stage 27 is positioned at the point X0, and the irradiation region 24A and the imaging region 50A are positioned at the point Xc. Because of this, the image of the scanning region A positioned at the point Xc is projected onto the imaging surface of the two-dimensional CCD sensor.

Then, in the time period TD of instants t1–t2 (FIG. 33(a)–(b)), while the movement of the irradiation region 24A, the imaging region 50A and the stage 27 is synchronized moving from point Xc toward point Xd, and tracks the scanning region A of the specimen 28. Accordingly, the image of the scanning region A is projected in a stationary state on the imaging surface of the two-dimensional CCD sensor 50. This image of the scanning region A is read out at intervals of 1/30 second. In the CRT 38, at intervals of about 0.5 second (corresponds to the period K), a stationary picture of the scanning region A is displayed.

Moreover, in the time period TU of instants t2–t3 (FIG. 33(b)–(c)), while the movement of the irradiation region 24A and the imaging region 50A is in the reverse direction (to the right in the drawing) from the movement of the stage 27 (leftward in the drawing), it is at a high speed.

Then, at instant t3 (FIG. 33(c)), the stage 27 is positioned at the point X1 separated by the length Lx/2 from the point X0, the irradiation region 24A and the imaging region 50A return to the point Xc again. Because of this, the image of the scanning region B positioned at the point Xc is projected onto the two-dimensional CCD sensor 50. Furthermore, this scanning region B is included in the above-mentioned half of the scanning region A.

Moreover, the period TD (instant t3–t4 (FIG. 33(c)–(d)), the irradiation region 24A and the imaging region 50A, while again synchronized with the movement of the stage 27 move from the point Xc toward the point Xd, and track the movement of the specimen 28. Accordingly, the image of the scanning region B is projected in a stationary state onto the imaging surface of the two-dimensional CCD sensor 50. This image of scanning region B is also read out similarly to the above-mentioned, and is displayed as a stationary picture on the CRT 38.

Moreover, the period TU of instants t4–t5 (FIG. 33(d)–(e)), the irradiation region 24A and the imaging region 50A move at high speed in the reverse direction to the movement direction of the stage 27.

Then at instant t5 (FIG. 33(e)), the stage 27 is positioned at point X2 which is separated by a length Lx/2 from the point X1, the irradiation region 24A and the imaging region 50A again return to the point Xc. Because of this, the image of the scanning region C positioned at the point Xc is projected on the imaging surface of the two-dimensional CCD sensor 50. Furthermore, this scanning region C includes half of the above-mentioned scanning region B.

Thereafter, similarly to the above-mentioned scanning region A and scanning region B, the image of the scanning region C is projected in a stationary state on the imaging surface of the two-dimensional CCD sensor 50. The image of this scanning region C is read out similarly to the above-mentioned, and a stationary picture of the scanning region C is displayed on the CRT 38.

Furthermore, in the fourth embodiment, the right-hand half of the above-mentioned scanning region A and the left-hand half of the scanning region B are in common, and the right-hand half of the scanning region B and the left-hand half of the scanning region C are in common. Accordingly, after the pictures of the scanning regions A–C have been acquired, when a process of joining the pictures is performed, by for example an averaging process on the common portions, the S/N ratio of the pictures can be increased.

As described above, by means of the fourth embodiment, added to the effects of the above-mentioned third embodiment, the range ΔX2 of the reciprocating movement of the irradiation region 24A and the imaging region 50A is narrowed, the effective visual range of the primary optical system 25 or secondary optical system 20 of scanning device 10 can be narrowed, and the device design becomes easy.

A fifth preferred embodiment is next described. This fifth preferred embodiment is a scanning device which does not include primary deflector 26 and the deflection control unit 67 from the imaging device 10 (FIGS. 18–21). In particular, the next several paragraphs describe the operation while acquiring picture information of specimen 28, while moving the stage 27 at a constant speed.

Here also for ease of understanding the description, the movement of the stage 27 is described as moving, for example, along X axis scanning direction.

In this manner, in the scanning device of the fifth embodiment, because the primary deflector 27 and the deflector control unit 67 are not disposed, the irradiation region 24A of the primary beam is stationary on the specimen surface 28.

Figure 23:
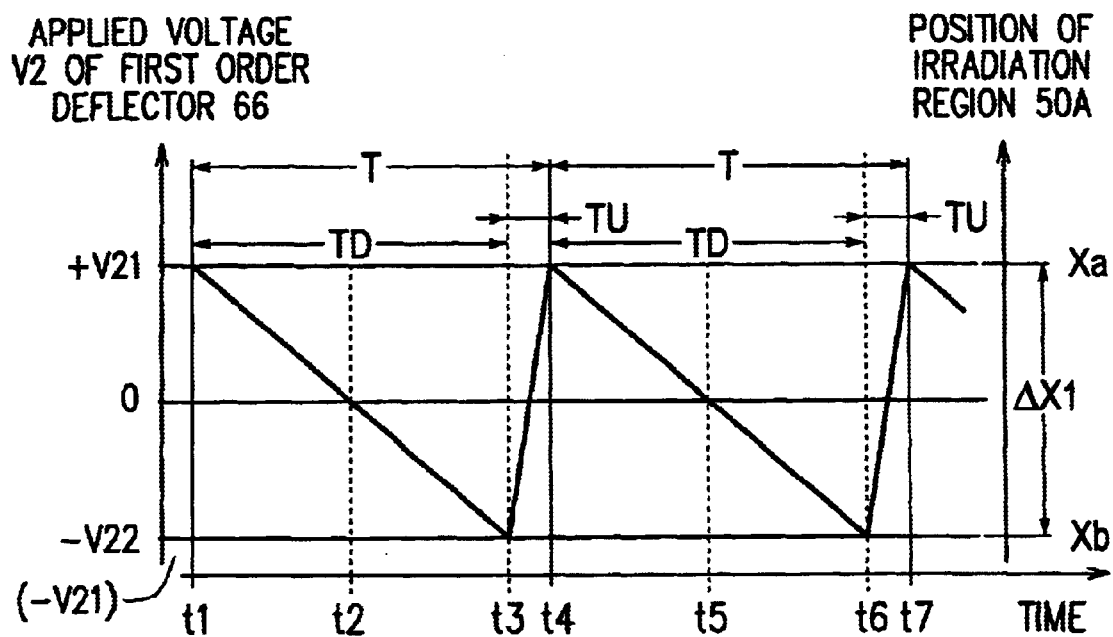
FIG. 23 is a diagram showing the voltage applied to the secondary deflector in the third preferred embodiment shown in FIG. 18.

Furthermore, in the scanning device of the fifth embodiment, the secondary deflector 66 and the deflection control unit 68 are disposed. Then, a voltage V2 is applied to the second deflector 66, similarly to the above-mentioned third embodiment (FIG. 23).

Then, the picture acquisition operation of the fifth embodiment, the irradiation region 24A being made stationary, is performed while causing reciprocating movement of the imaging region 50A within a movement range ΔX1 (about equal to the length Lx of the imaging region 50A).

Figure 34:
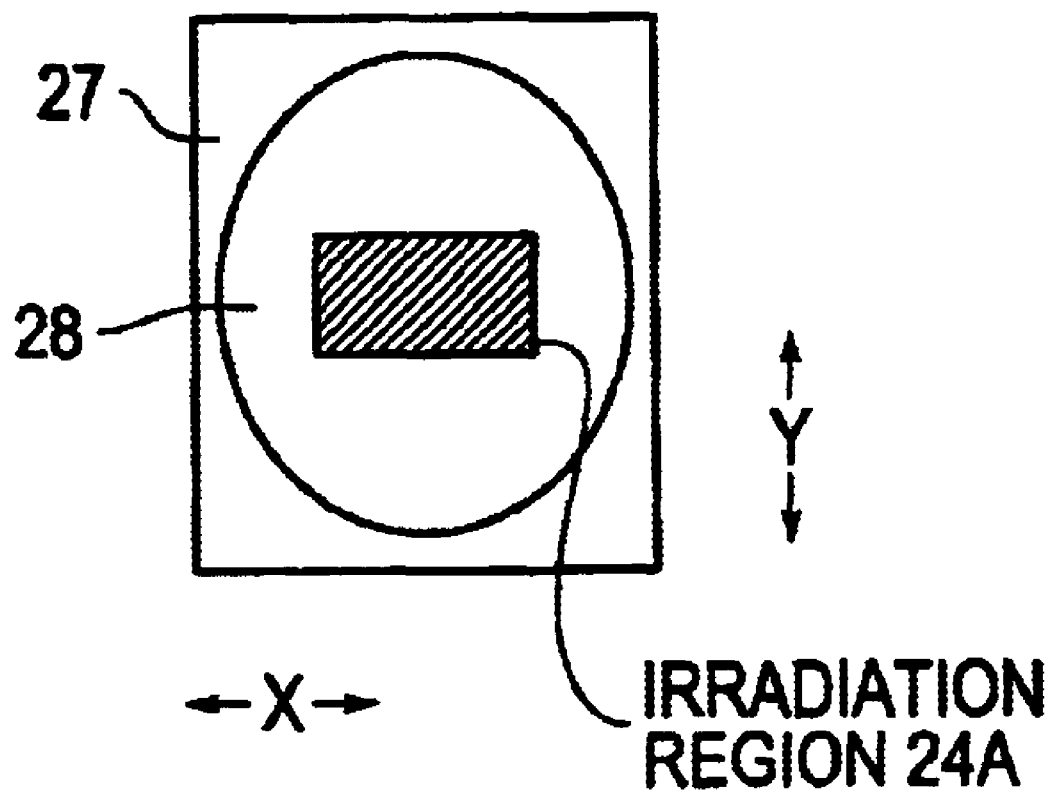
FIG. 34 is a diagram which illustrates the irradiation region of the primary beam according to a fifth preferred embodiment of the present invention.
Figure 35:
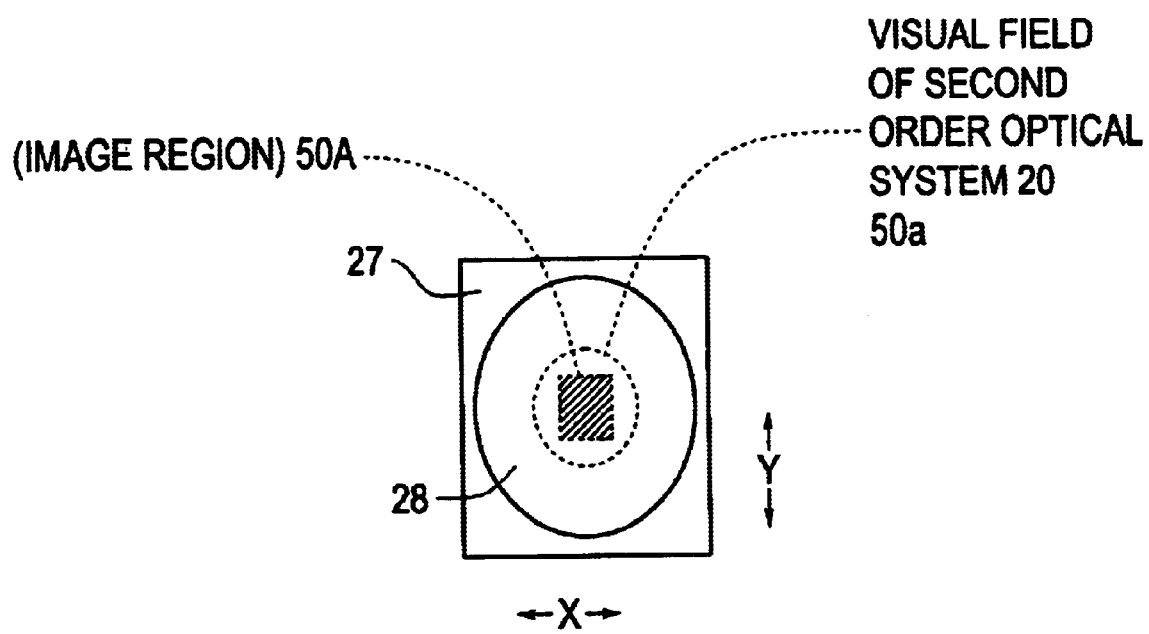
FIG. 35 is a diagram which illustrates an imaging region in relation to the embodiment shown in FIG. 34.

Here, the shape of the irradiation region 24A is shaped according to the shape of the imaging region 50A, in the fifth embodiment, as shown in FIG. 34, the imaging region 50A (FIG. 35) is shaped to 2 shapes juxtaposed along the X axis.

Accordingly, the picture information of the specimen 28 positioned on the stage 27 is acquired as follows.

Figure 36:
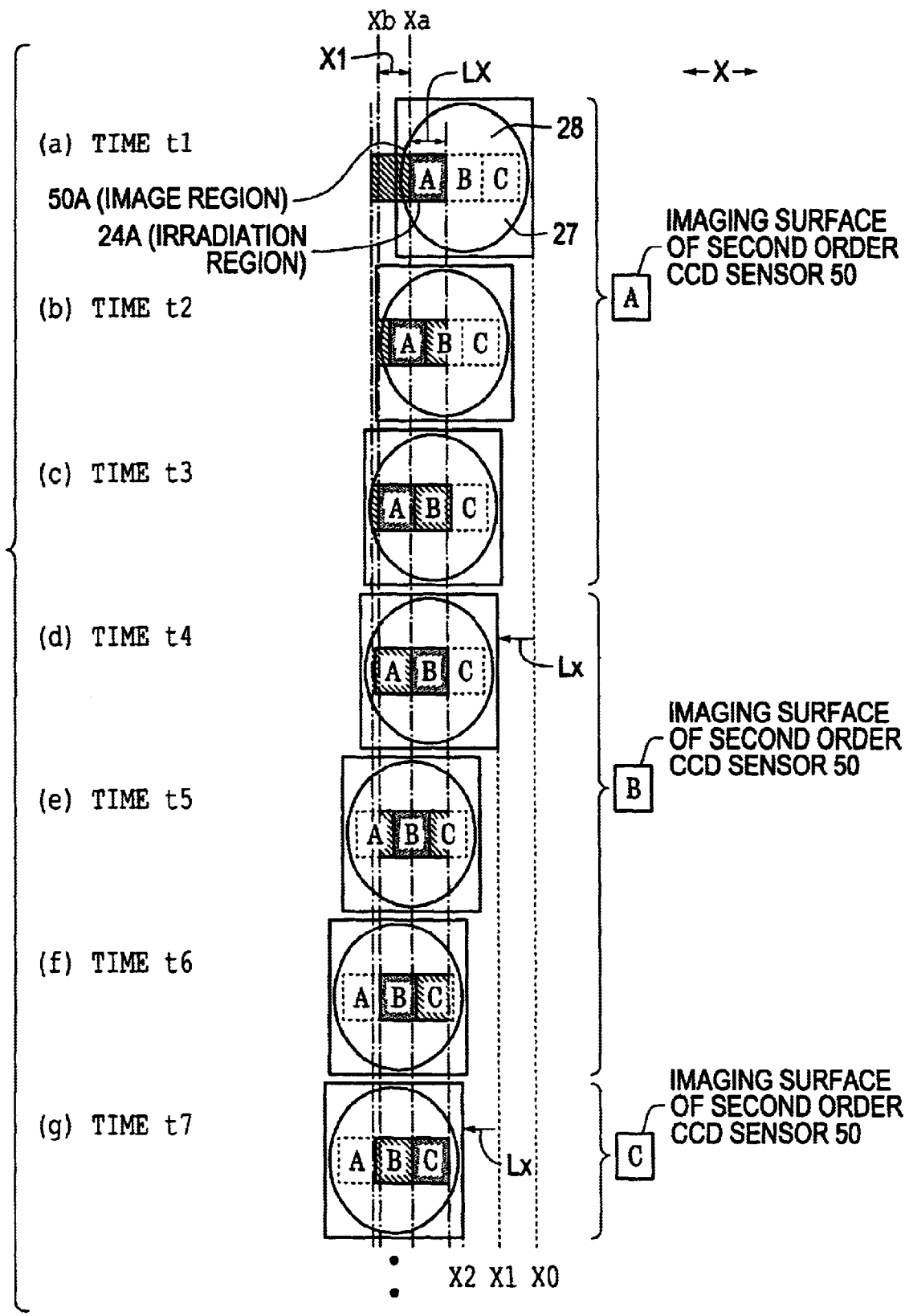
FIG. 36 is a diagram which illustrates picture acquisition operations in relation to the fifth preferred embodiment shown in FIG. 34.

Firstly, at the instant t1 (FIG. 36($a$)), the stage 27 is positioned at the point X0, and the imaging region 50A is positioned at the point Xa. At this time, the irradiation region 24A and the imaging region 50A become in a superposed state in the scanning region A positioned at the point Xa (the superposition of the irradiation region 24A and the imaging region 50A is shown by the cross-hatched portion in FIG. 36($a$)).

Accordingly, the image of the scanning region A positioned at the point Xa is projected onto the imaging surface of the two-dimensional CCD sensor 50.

Then, the period TD of instant t1–t3 (FIG. 36($a$)–($c$)) the imaging region 50A tracks the scanning region A of the specimen 28, moving from the point Xa toward the point Xb while synchronizing with the movement of the stage 27. Accordingly, the image of the scanning region A is projected in a stationary state on the imaging surface of the two-dimensional CCD sensor 50. This image of the scanning region A is read out at intervals of 1/30 second. A stationary picture of the scanning region A is displayed at 1 second intervals (corresponding to the period T) on the CRT 38.

Moreover, in period TU of instant t3–t4 (FIG. 36($c$)–($d$), the imaging region 50A is moved at high speed in the reverse direction to the direction of movement of the stage 27.

Then, at instant t4 (FIG. 36($d$)), the stage 27 is positioned at the point X1, separated by a length Lx from the point X0; the imaging region 50A returns to the point Xa again.

At this time, the irradiation region 24A and the imaging region 50A are in a superposed state in the scanning region B positioned at the point Xa (the cross-hatching portion in FIG. 36($d$)). Accordingly, the image of the scanning region B, positioned at the point Xa, is projected in the imaging surface of the two-dimensional CCD sensor 50.

Moreover, in the period TD of instant t4–t6 (FIG. 36($d$)–($f$)) the imaging region 50A tracks the scanning region B of the specimen 28, moving from the point Xa toward the point Xb while synchronizing with the movement of the stage 27. Accordingly, the image of the scanning region B is projected in a stationary state on the imaging surface of the two-dimensional CCD sensor 50. This image of the scanning region B is read out similarly to the above-mentioned, and a stationary picture of the scanning region B is displayed on the CRT 38.

Moreover, in period TD of instant t6–t7, the imaging region 50A is moved at high speed in the reverse direction to the direction of movement of the stage 27.

Then, at instant t7 (FIG. 36($g$)), the stage 27 is positioned at the point X2, separated by a length Lx from the point X1; the imaging region 50A returns to the point Xa again.

At this time, the irradiation region 24A and the imaging region 50A are in a superposed state in the scanning region C positioned at the point Xa (the cross-hatching portion in FIG. 36($g$)). Accordingly, the image of the scanning region C, positioned at the point Xa, is projected in the imaging surface of the two-dimensional CCD sensor 50. Furthermore, this scanning region C is adjacent to the above-mentioned scanning region B.

Thereafter, similarly to the time of the above-mentioned scanning region A and scanning region B, the image of the scanning region C is projected in a stationary state on the imaging surface of the two-dimensional CCD sensor 50. The image of this scanning region C is read out similarly to the above-mentioned, and a stationary picture of the scanning region C is displayed on the CRT 38.

As described above, by means of the fifth embodiment, in addition to the effects of the above-mentioned third embodiment, the constitution of the scanning device 10 is simplified to the extent that the primary deflector 26 and the deflector control unit 67 are omitted.

Furthermore, in the above-mentioned fifth embodiment, a case has been described in which the irradiation region 24A of the primary beam is made long and slender along the X axis, but this is because movement of the stage 27 in the X direction was assumed, in cases assuming that the movement of the stage 27 is in the Y direction or an oblique direction, it is necessary to put the irradiation region 24A wide in the movement direction also.

Moreover, in the above-mentioned fifth embodiment, an example was described making the shape of the irradiation region 24A two times long and slender, but for example as in the above-mentioned fourth embodiment, in a case in which the range ΔX2 of the reciprocating movement of the imaging region 50A is equal to Lx/2, the shape of the irradiation, region 24A also, may be shaped to a shape of 1.5-fold the imaging region 50A along the X axis.

Furthermore, in the above-mentioned fifth embodiment, the shape of the irradiation region 24A is shaped according to the shape of the imaging surface of the two-dimensional CCD sensor 50; only the region of the specimen 28 which is necessary for picture acquisition comes to be irradiated by the primary beam, because the region was made to correspond to the whole movement range of the imaging region 50A. Accordingly, the primary beam can irradiate with good efficiency. Moreover, it can contribute to preventing charging up and contamination of the specimen 28.

A sixth preferred embodiment is next described. Here, in a scanning device of a constitution with the secondary deflector 66 and the deflection control unit 68 omitted from the scanning device 10 (FIGS. 18–21) of the third embodiment, describes the operation, while movement of the stage 27 at a constant speed is caused, during the picture acquisition of the specimen 28.

Here also, for ease of understanding the description, the description is performed, as an example, of the case in which the stage 27 moves at a constant speed along an X axis scanning direction.

In this manner, in the scanning device of the sixth embodiment, the secondary deflector 66 and the deflection control unit 68 are not disposed, the imaging region 50A is stationary on the specimen 28 surface.

Figure 30:
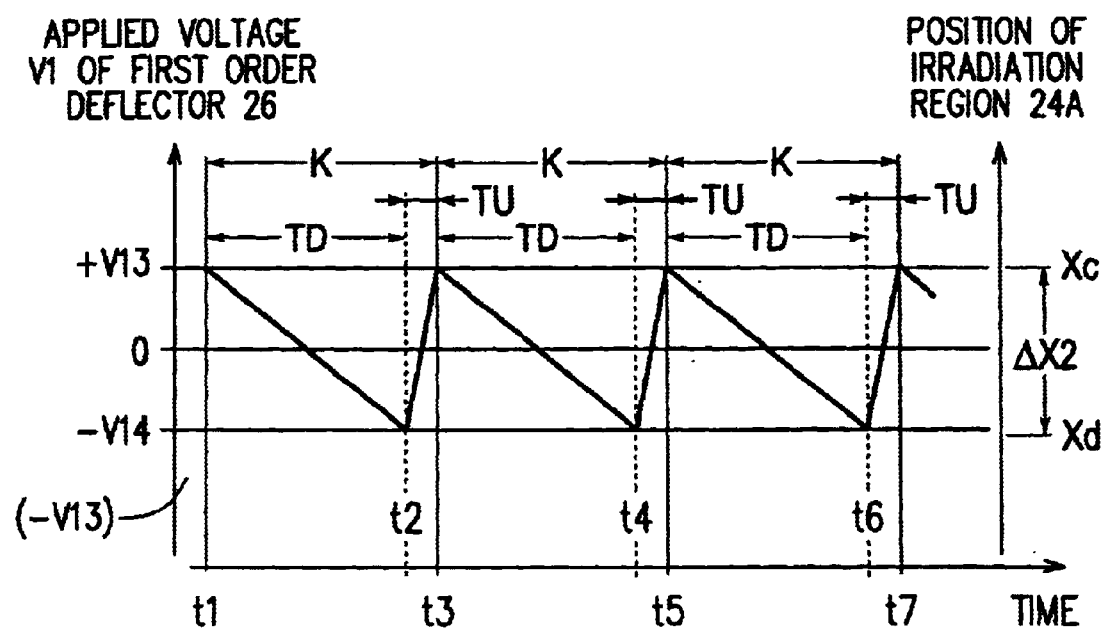
FIG. 30 is a diagram showing the voltage applied to a primary deflector according to a fourth preferred embodiment of the present invention.
Figure 31:
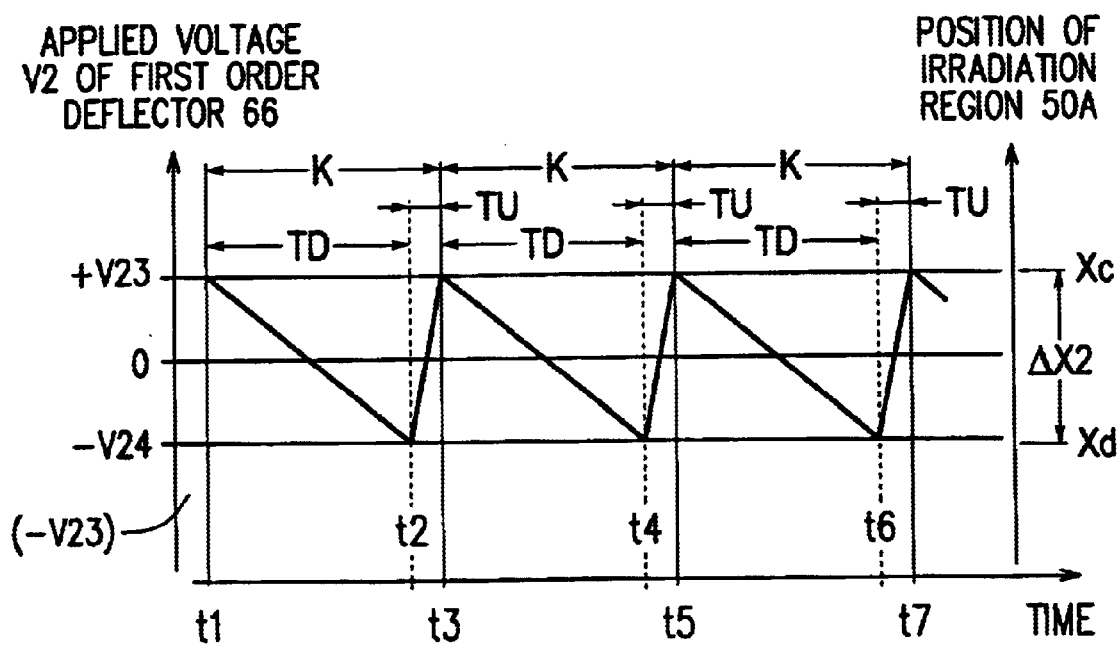
FIG. 31 is a diagram showing the voltage applied to the secondary deflector in the fourth preferred embodiment shown in FIG. 30.

Furthermore, in the scanning device of the sixth embodiment, the primary deflector 26 and the deflector control unit 67 are disposed. Then, a voltage V1 is applied to the primary deflector 26, similarly to the above-mentioned fourth embodiment (FIG. 30).

Then, the picture acquisition operation of the sixth embodiment, causes the imaging region 50A to be stationary, while causing a reciprocating movement of the irradiation region 24A within a range ΔX2 (about equal to half of the length Lx of the imaging region 50A).

Figure 37:
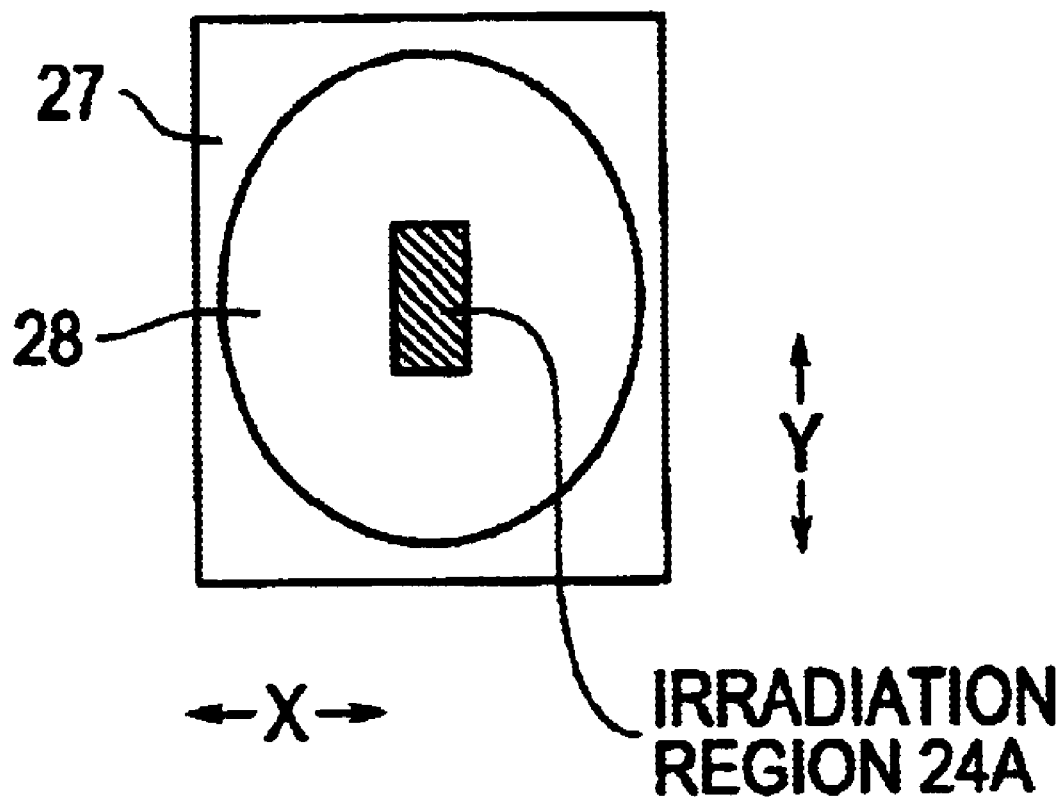
FIG. 37 is a diagram which illustrates the irradiation region of the primary beam for a picture acquisition operation according to a sixth preferred embodiment of the present invention.
Figure 38:
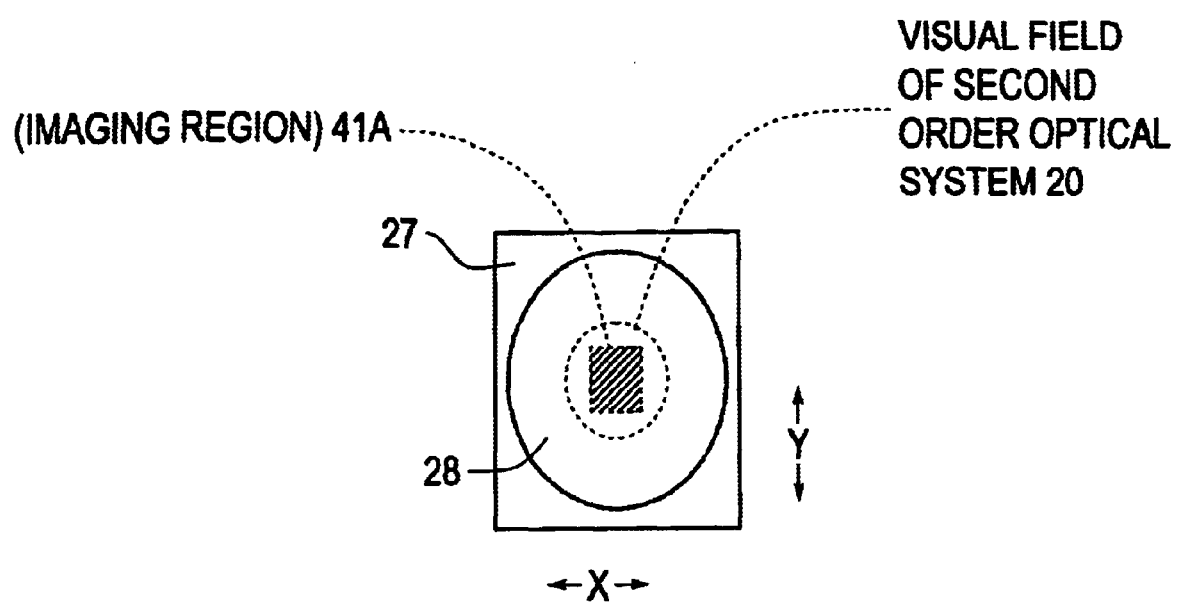
FIG. 38 is a diagram which illustrates an imaging region in relation to the embodiment shown in FIG. 37.

Here, the shape of the irradiation region 24A is shaped corresponding to the shape of the imaging region 50A, in the sixth embodiment, as shown in FIG. 37, the imaging region 50A (FIG. 38) is shaped to a shape made ½-fold along the X axis.

Accordingly, the picture information of the specimen 28 positioned on the stage 27 is acquired as follows.

Figure 39:
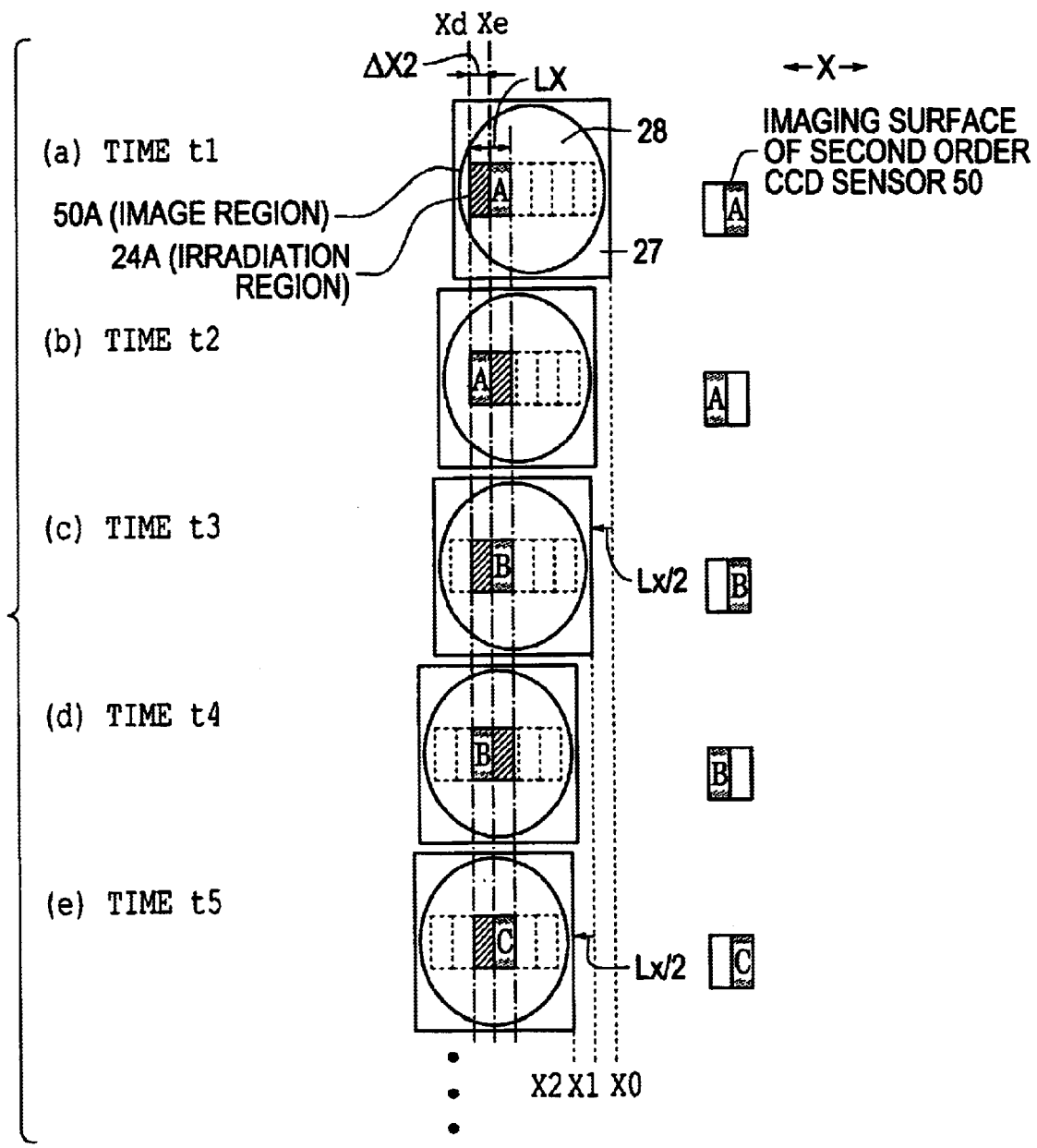
FIG. 39 is a diagram which illustrates picture acquisition operations in relation to the sixth preferred embodiment in FIG. 37.

Firstly, at the instant t1 (FIG. 39(a)), the stage is positioned at the point X0, the irradiation region 24A is positioned at the point Xc. At this time, the irradiation region 24A and the imaging region 50A are in a superposed state in the scanning region A positioned at the point Xc (the superposition of the irradiation region 24A and the imaging region 50A is shown by the cross hatching portion of FIG. 39(a)). Accordingly, the image of the scanning region A positioned at the point Xc is projected onto the imaging surface of the two-dimensional CCD sensor 50.

Then, in the time period TD of instants t1–t2 (FIG. 39(a)–(b)), while the movement of the irradiation region 24A, the imaging region 50A and the stage 27 is synchronized moving from point Xc toward point Xd, tracks the scanning region A of the specimen 28. Accordingly, the image of the scanning region A is projected in a stationary state on the imaging surface of the two-dimensional CCD sensor 50. This image of the scanning region A moves on the imaging surface according to the movement of the stage 27. Moreover, this image of the scanning region A is read out at intervals of ⅟30 second. In the CRT 38, at intervals of about 0.5 second (corresponds to the period K), a stationary picture of the scanning region A is displayed.

Moreover, in the time period TU of instants t2–t3 (FIG. 39(b)–(c)), the movement of the irradiation region 24A is at a high speed in the reverse direction from the movement of the stage 27.

Then, at instant t3 (FIG. 39(c)), the stage 27 is positioned at the point X1 separated by the length Lx/2 from the point X0, the irradiation region 24A returns to the point Xc again.

At this time, the irradiation region 24A and the imaging region 50A are in a superposed state in the scanning region B positioned at the point Xc (shown by cross hatching in FIG. 39(c)). Accordingly, the image of the scanning region B positioned at the point Xc is projected onto the two-dimensional CCD sensor 50. Furthermore, this scanning region B is included in the above-mentioned half of the scanning region A.

Moreover, in the period TD of instants t3–t4 (FIG. 39(c) –(d)), the irradiation region 24A, while again synchronized with the movement of the stage 27, moves from the point Xc toward the point Xd, and tracks the movement of the specimen 28. Accordingly, the image of the scanning region B is projected in a stationary state onto the imaging surface of the two-dimensional CCD sensor 50. This image of the scanning region A moves on the imaging surface according to the movement of the stage 27. Moreover, this image of scanning region B is also read out similarly to the above-mentioned, and is displayed as a stationary picture on the CRT 38.

Moreover, in the period TU of instants t4–t5 (FIG. 39(d) –(e)), the irradiation region 24A moves at high speed in the reverse direction to the movement direction of the stage 27.

Then at instant t5 (FIG. 39(e)), the stage 27 is positioned at point X2 which is separated by a length Lx/2 from the point X1, the irradiation region 24A again returns to the point Xc.

At this time, the irradiation region 24A and the imaging region 50A become in a superposed state in the scanning region C positioned at the point Xc (shown by cross hatching in FIG. 39e. Accordingly, the scanning region C positioned at the point Xc is projected onto the two-dimensional CCD sensor 50. Furthermore, this scanning region C is included in the above-mentioned half of the scanning region B.

Thereafter, similarly to the above-mentioned scanning region A and scanning region B, the image of the scanning region C is projected in a stationary state on the imaging surface of the two-dimensional CCD sensor 50. This image of the scanning region C also moves on the imaging surface according to the movement of the stage 27. Moreover, the image of this scanning region C is read out similarly to the above-mentioned, and a stationary picture of the scanning region C is displayed on the CRT 38.

Moreover, in the sixth embodiment, as described above, the image projected on the imaging surface of the two-dimensional CCD sensor moves on the imaging surface according to the movement of the stage 27. Because of this, picture acquisition is only from the necessary area of the two-dimensional CCD sensor, and by performing the addition of the acquired pictures while displacing the acquisition area synchronously with the movement of the stage 27, pictures can be obtained having a high S/N ratio.

As described above, by means of the sixth embodiment, the constitution of the scanning device 10 can be simplified to the extent of omission of the secondary deflector 66 and the deflector control unit 67.

Moreover, in the above-mentioned sixth embodiment, the shape of the irradiation region 24A is shaped according to the shape of the imaging surface of the two-dimensional CCD sensor 50; because made as a half of the imaging region 50A, only the region of the specimen 28 which is necessary for picture acquisition comes to be irradiated by the primary beam. Accordingly, the primary beam can irradiate with good efficiency. Moreover, it can contribute to preventing charging up and contamination of the specimen 28.

Moreover, by means of the above-mentioned sixth embodiment, the irradiation region 24A of the primary beam has been described for the case that it is made narrow along the X axis; this was because the stage was assumed to move in the X axis direction, and in cases assuming that the movement of the stage 27 is in the Y direction or an oblique direction, may be made narrow in this movement direction also.

Furthermore, in the above-mentioned embodiments, the signal charge accumulated in the two-dimensional CCD sensor 50 is described, by way of example, as being read out at intervals of 1/30 second, but the output timing (shutter time) of the signal charge from the two-dimensional CCD sensor 5 to the picture processing unit 42 is not limited to this.

For example, in the case that the amount of light in the imaging surface of the two-dimensional CCD sensor is insufficient, disposing a lengthened shutter time, reading out after the signal charge in the respective light receiving pixels has been added, the S/N ratio can be increased. Furthermore, the shutter time of the two-dimensional CCD sensor 50 can be set long, up to a time corresponding to the above-mentioned period T (or the period K).

Furthermore, in the above-mentioned embodiments 3–6, examples are described of a low speed scan time of the stage 27, namely a period T of 1 second (or a period K of 0.5 second), but this period T (or period K) can change according to the speed Vx of the stage 27. In a case in which the amount of light is sufficient at the imaging surface of the two-dimensional CCD sensor 50, the period T (or period K), scanning is also possible by means of a high speed scan of 1/30 second.

Moreover, in the above-mentioned embodiments 3–6, examples have been described which image specimen pictures by a two-dimensional CCD sensor 50 which has plural light receiving pixels arrayed two-dimensionally, but instead of such a two-dimensional CCD sensor 50, specimen pictures may be imaged by an image sensor consisting of plural line CCD sensors arranged parallel.

Moreover, in the scanning device 10 of FIG. 18 until the primary beam is irradiated onto the specimen, and until the secondary beam from the specimen is detected by the detector 36, the described constitution had the cathode lens 29, Wien filter 31 and the like in common, but the primary beam system which is the path of the primary beam, and the secondary beam system which is the path of the secondary beam, may be equipped with respective cathode lenses and caused to be respectively independent.

Furthermore, in the above-mentioned embodiments 3–6, a description was given of a scanning device which used an electron beam, but the present invention can also apply to the picture alignment of EB exposure devices.

Moreover, by means of the present invention, by means of the use of a two-dimensional CCD sensor, or plural line CCD sensors arranged as an image sensor, contributes to the reduction of cost.

Even in cases in which the stage moves in any direction, because specimen pictures can be continuously acquired with good efficiency from plural scanning regions arranged along the movement direction, the degree of freedom of scanning is wide, and in addition it becomes a scanning device of good convenience in use.

Thus, having fully described the present invention by way of example with reference to the attached drawing figures, it will be readily appreciated that many changes and modifications may be made to the invention and to the embodiments shown and/or described herein without departing from the spirit or scope of the present invention which is defined in and covered by the appended claims.

What is claimed is:

1. A scanning device, comprising:
a movable stage on which a specimen is positioned;
irradiation means which irradiates an electron beam onto an irradiation region of said specimen;
secondary beam detection means used in generating a picture of said irradiation region by detecting a secondary beam which consists of at least one of secondary electrons or reflected electrons from the irradiation region of the said electron beam;
an imaging electron optical system which causes imaging of said secondary beam on a detection surface of said secondary beam detection means, and which is arranged between said specimen and said secondary beam detection means;
said secondary beam detection means is equipped with a fluorescent unit which is arranged on said detection surface, and which converts said secondary beam into light, and one-dimensional line sensors which have a structure arrayed in two dimensions forming electric charge by photoelectric conversion, an array imaging element which continuously adds up the electric charge of the accumulated image in a predetermined line of said line sensors, and the electric charge of the line of said image which moves accompanying the movement of said stage, and a two-dimensional imaging element which generates electric charge by means of photoelectric conversion; and
changeover means for selectively irradiating the light converted by means of said fluorescent unit to an imaging element which is either one of said array imaging elements and said two-dimensional imaging element.

2. The scanning device according to claim 1, wherein said array imaging element is a TDI array CCD sensor, said two-dimensional imaging element is a two-dimensional CCD sensor, one sensor among said sensors is arranged in the light path of light converted by means of said fluorescent unit, said changeover means is equipped with a mirror arranged between said fluorescent unit and said one sensor, a mirror drive unit which drives insertion and removal of said mirror with respect to said light path, said mirror drive unit removing said mirror from said light path so as to irradiate said light to said one sensor, to cause reflection by inserting said mirror in said light path, and to irradiate said reflected light to another sensor.

3. The scanning device according to claim 1, said
irradiation means irradiating electrons in the form of a spot beam onto a specimen surface and onto a surface having a larger area than a beam cross section of said spot beam,
the scanning device further comprising scanning means which causes scanning on said specimen surface of said spot beam,
whereby said spot beam is irradiated onto the specimen surface, the electrons of at least one of secondary electrons or reflected electrons emitted from its irradiation region being detected, a picture of the scanning region being formed by means of said scanning means.

4. A scanning method, comprising the steps of:
irradiating an electron beam on a specimen positioned on a driveable stage;

causing imaging of a secondary beam which consists of at least one of secondary electrons or reflected electrons emitted from the irradiation region of said electron beam onto a fluorescent surface which converts the electron beam into light;

imaging the irradiation region of said electron beam receiving light by means of a TDI type of array imaging element, forming electric charge by photoelectric conversion of the light converted by means of said fluorescent surface, and causing a shift of this electric charge within the element according to the movement of said stage; and imaging the irradiation region of said electron beam by receiving by means of the two-dimensional CCD sensor the light which was converted by means of said fluorescent surface.

5. The scanning method according to claim 4, further comprising the steps of:

generating an electric charge by photoelectric conversion of the light converted by means of said fluorescent surface;

causing a shift of said electric charge within the element according to the movement of said stage;

detecting defective places of the specimen from pictures of the irradiation regions of said electron beam;

irradiating the electron beam on said defective places and causing imaging on said fluorescent surface of said secondary beam emitted from said irradiation region; and imaging said defective places and receiving by means of the two-dimensional imaging element light which was converted by means of said fluorescent surface.

6. The scanning device according to claim 1, further comprising:

projection means which has an electron optical system which images in a predetermined plane the secondary beam which is emitted from said specimen due to the irradiation of said electron beam, and which projects on to said predetermined plane an image of said secondary beam from a specimen positioned within the visual field of the said electron optical system;

deflecting means which deflects the locus of at least one of said electron beam and said secondary beam;

picture acquisition means which has an image sensor which images said image projected on said predetermined plane, and which acquires the picture information corresponding to image projected on to said predetermined plane based on the output signal from the said image sensor; and control means which causes synchronism of the movement of said specimen which accompanies movement of said stage, and deflection of said locus by means of said deflecting means.

7. The scanning device according to claim 1, wherein said irradiation means has a beam shaping means which shapes the irradiation region of said electron beam according to the shape of the image plane of said image sensor.

8. The scanning device according to claim 6, wherein said deflecting means is one which deflects the locus of said electron beam and the locus of said secondary beam, said control means causes synchronism of the locus of said electron beam and the locus of said secondary beam by means of said deflecting means.

9. The scanning device according to claim 6, wherein said control means performs control of said deflecting means synchronized with the movement of said specimen, and alternately controls said deflecting means which does not cause synchronism with the movement of said specimen.

10. The scanning device according to claim 6, wherein said image sensor is a two-dimensional CCD image element which has plural light receiving pixels which are two-dimensionally arrayed.

11. The scanning method according to claim 4, further comprising the steps of:

causing movement of a stage on which a specimen is positioned;

detecting, in synchronicity with the movement of said specimen during said causing step, the secondary beam which is reflected from said specimen irradiated during said irradiating step.

* * * * *